(12) United States Patent
Hon et al.

(10) Patent No.: US 9,232,586 B2
(45) Date of Patent: Jan. 5, 2016

(54) LIGHT-EMITTING DEVICE

(75) Inventors: Schang-Jing Hon, Hsinchu (TW);
Chao-Hsing Chen, Hsinchu (TW);
Hsin-Mao Liu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 158 days.

(21) Appl. No.: 13/336,735

(22) Filed: Dec. 23, 2011

(65) Prior Publication Data

US 2012/0161651 A1 Jun. 28, 2012

(30) Foreign Application Priority Data

Dec. 24, 2010 (TW) .............................. 99145713 A
Apr. 27, 2011 (TW) .............................. 100114902 A

(51) Int. Cl.
*H05B 37/02* (2006.01)
*H05B 33/08* (2006.01)

(52) U.S. Cl.
CPC ........ H05B 33/0824 (2013.01); H05B 33/0815 (2013.01); *H01L 2924/0002* (2013.01); *Y02B 20/346* (2013.01)

(58) Field of Classification Search
CPC ............... H05B 37/02; H05B 33/0806; H05B 33/0815; H05B 33/0842; H05B 33/0851; H05B 33/0824; H05B 33/0809; H05B 33/0827; H05B 33/083
USPC ...... 315/185 R, 191, 192, 250, 291, 294, 308
See application file for complete search history.

(56) References Cited

U.S. PATENT DOCUMENTS

| 2008/0211421 | A1* | 9/2008 | Lee et al. ....................... 315/250 |
| 2010/0231135 | A1* | 9/2010 | Hum et al. ..................... 315/250 |
| 2010/0283322 | A1* | 11/2010 | Wibben ........................... 307/31 |
| 2011/0127922 | A1* | 6/2011 | Sauerlaender ................. 315/192 |
| 2012/0256550 | A1* | 10/2012 | Akiyama ....................... 315/187 |
| 2012/0299490 | A1* | 11/2012 | Lee et al. ....................... 315/191 |

FOREIGN PATENT DOCUMENTS

| CN | 2774069 | | 4/2006 |
| JP | 2005-310998 A | | 11/2005 |
| JP | 2009-188135 A | | 8/2009 |
| JP | 2009283775 A | * | 12/2009 |
| JP | 2010-272846 A | | 12/2010 |
| JP | 2011-149760 A | | 12/2011 |
| KR | 10-2010-0126161 A | | 12/2010 |
| KR | 10-2011-0007706 A | | 1/2011 |
| WO | WO 2010/013172 A1 | | 2/2010 |
| WO | WO 2010/013177 A1 | | 2/2010 |
| WO | WO 2011/077909 A1 | | 6/2011 |

* cited by examiner

*Primary Examiner* — Thai Pham
(74) *Attorney, Agent, or Firm* — Muncy, Geissler, Olds & Lowe, P.C.

(57) ABSTRACT

A light-emitting device is capable of receiving a first voltage signal, a second voltage signal, and a third voltage signal in sequence. The light-emitting device includes a first light-emitting unit, a second light-emitting unit, and a switching. The first voltage signal, the second voltage signal, and the third voltage signal is configured to introduce a first current signal, a second current signal, and a third current signal, respectively. The light-emitting device is configured to emit a first light when introducing the first current signal, the second current signal, and the third current signal. The light-emitting device is configured to emit a second light when introducing the second current signal and the third current signal. The light-emitting device is configured to emit a third light when introducing the second current signal.

9 Claims, 30 Drawing Sheets

US 9,232,586 B2

LIGHT-EMITTING DEVICE

This application claims the right of priority based on TW application Ser. No. 099145713 filed on Dec. 24, 2010 and TW application Ser. No. 100114902 filed on Apr. 27, 2011, the contents of which are incorporated herein by reference in their entireties.

BACKGROUND

1. Technical Field

The present disclosure relates to a light-emitting device, and in particular to a light-emitting device comprising a first light-emitting unit, a second light-emitting unit, and a first switching unit, wherein the electrical connection between the first and second light-emitting units is controlled by the first switching unit.

2. Description of the Related Art

The light-emitting diodes (LEDs) of the solid-state lighting elements have the characteristics of the low power consumption, low heat generation, long operational life, shockproof, small volume, quick response and good opto-electrical property like light emission with a stable wavelength, so the LEDs have been widely used in household appliances, indicator light of instruments, and opto-electrical products, etc.

The conventional LED is driven by direct current (DC). An AC-DC converter is required to convert DC to AC. Since the converter has a large volume and heavy weight, the cost is added and the power is lost during converting. It is difficult for LED to compete with the existing light source mainly because of the price concern.

Alternating current light-emitting diodes (ACLED) have been developed to resolve the aforesaid problems and have advantages in small volume, lightweight, and low cost. In addition, 15%-30% electrical power loss produced by converting alternating current to direct current is reduced in the conventional LED, thereby improving the total efficiency of LEDs.

However, an operating voltage of the above-described ACLED is relatively high. Therefore, ACLED is not operated at most ranges of the alternating supply voltage.

SUMMARY OF THE DISCLOSURE

The present disclosure provides a light-emitting device capable of receiving a periodic voltage signal comprising a first voltage signal and a second voltage signal.

A light-emitting device is capable of receiving a periodic voltage signal comprising a first voltage signal, a second voltage signal, and a third voltage signal in sequence. The light-emitting device includes a first light-emitting unit, a second light-emitting unit, and a switching unit electrically connected to the first light-emitting unit and the second light-emitting unit. The first voltage signal, the second voltage signal, and the third voltage signal is configured to introduce a first current signal, a second current signal, and a third current signal, respectively. The light-emitting device is configured to emit a first light when introducing the first current signal, the second current signal, and the third current signal in sequence. The light-emitting device is configured to emit a second light when introducing the second current signal and the third current signal without introducing the first current signal in advance. The light-emitting device is configured to emit a third light when introducing the second current signal without introducing the first current signal and the third current signal.

The light-emitting device comprises: a first light-emitting unit; a second light-emitting unit; and a first switching unit comprising at least three switches for receiving the periodic voltage signal. The at least three switches are electrically connected with the first and second light-emitting units such that the first and second light-emitting units are connected in parallel with each other in the first voltage signal, and are connected in series with each other in the second voltage signal.

In another embodiment of the present disclosure, a light-emitting device is provided. The light-emitting device comprises: X numbers of light-emitting units, X≥3; and at least 3*(X−1) switching units for receiving a periodic voltage signal, the periodic voltage signal comprising a plurality of different voltage signals. The switching units are connected with the light-emitting units such that the light-emitting units are connected with each other in at least two different connections corresponding to the different voltage signals.

BRIEF DESCRIPTION OF THE DRAWINGS

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1A:
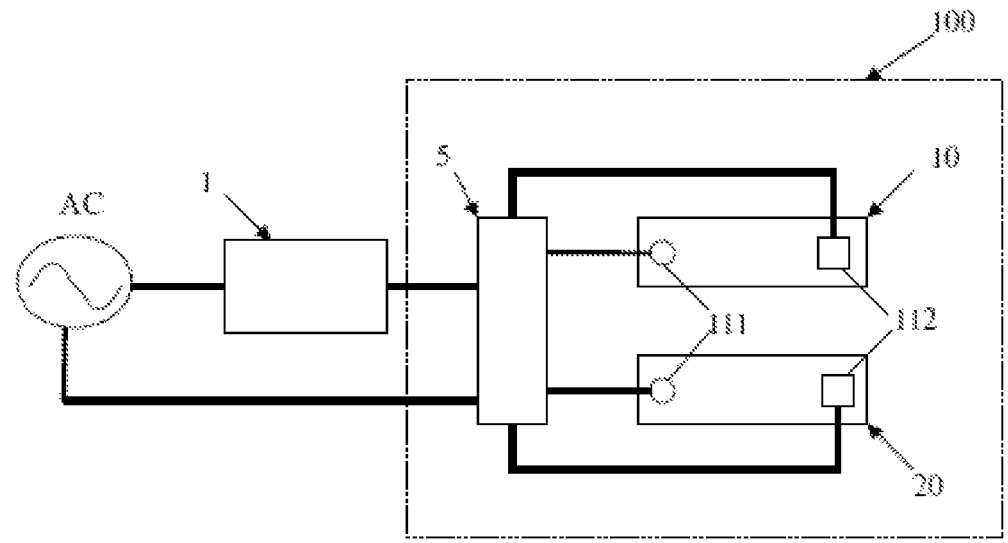
FIGS. 1A and 1B show a circuit diagram of a light-emitting device in accordance with the first embodiment of the present disclosure.

FIG. 1A discloses a light-emitting device 100 according to the first embodiment of the present disclosure. The light-emitting device 100 comprises a first switching unit 5 electrically to a power source for receiving a periodic voltage signal from the power source, and a first and a second light-emitting units 10, 20. Each of the first and second light-emitting units 10, 20 comprises a first bonding pad 111 and a second bonding pad 112, and thus the first and second light-emitting units 10, 20 are electrically independent and are able to respectively and electrically connect with the first switching unit 5. In this embodiment, the power source is an alternating current (AC) power supply and the periodic voltage signal is an alternating current signal having a frequency of 50-60 Hz. The alternating current signal is rectified to a direct current signal by a rectifier 1 and the direct current signal is also a periodic voltage signal (pulsed direct current).

Figure 1B:
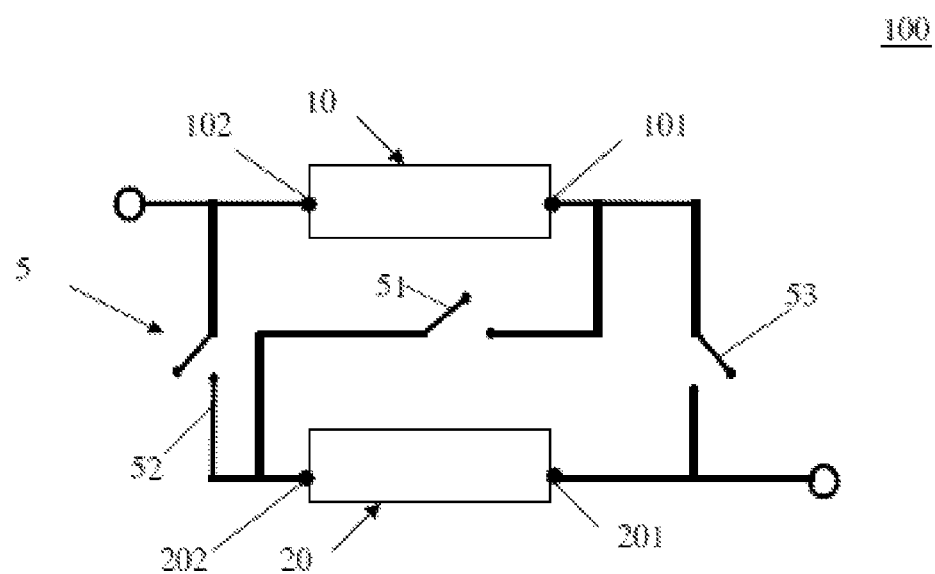
Figure 2A:
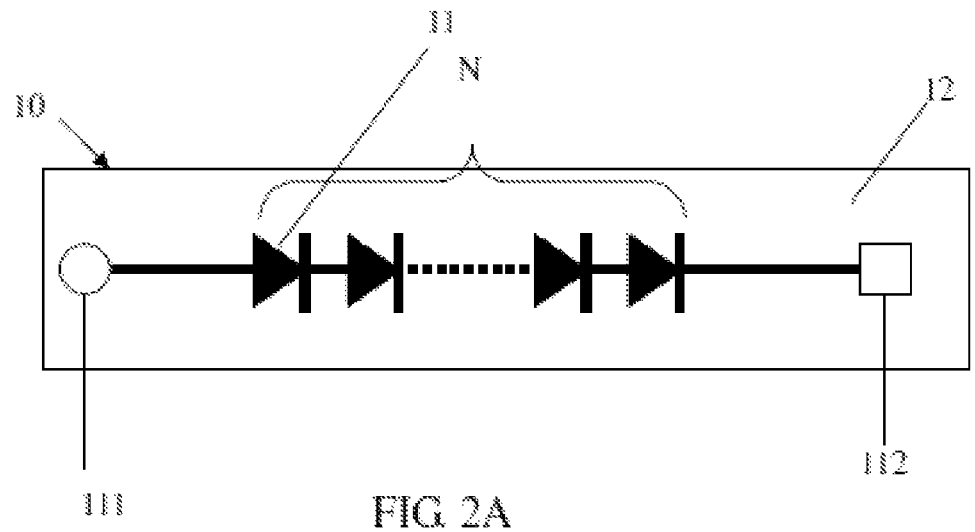
FIG. 2A is a circuit diagram of the first embodiment showing a first light-emitting unit.
Figure 2B:
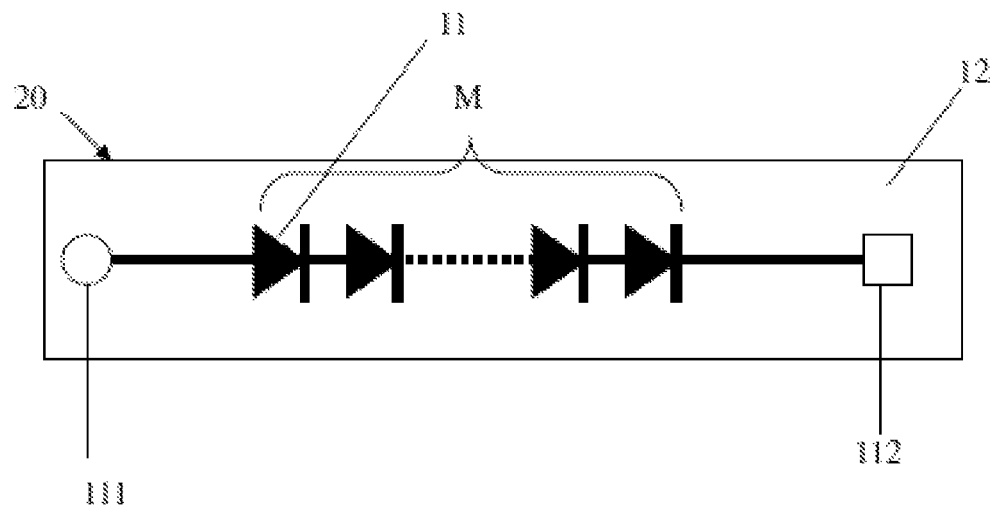
FIG. 2B is a circuit diagram of the first embodiment showing a second light-emitting unit.

As shown in FIG. 1B, each of the first and second light-emitting units 10, 20 comprises a first electrical end point 101, 201 and a second electrical end point 102, 202. The first electrical end points 101, 201 and the second electrical end points 102, 202 are respectively corresponding to the first bonding pad 111 and the second bonding pad 112 of FIG. 1A. The first switching unit 5 comprises a first switch 51 connecting the first electrical end point 101 of the first light-emitting unit 10 and the second electrical end point 202 of the second light-emitting unit 20, a second switch 52 connecting the second electrical end points 102, 202 of the first and second light-emitting units 10, 20, and a third switch 53 connecting the first electrical end points 101, 201 of the first and second light-emitting units 10, 20. In this embodiment, as shown in FIGS. 2A and 2B, each of the first and second light-emitting units 10, 20 is a light-emitting array chip comprising a plurality of light-emitting diodes 11 commonly formed on a substrate 12. Alternatively, a plurality of light-emitting diodes 11 is commonly formed on a substrate to form a light-emitting array chip, and some of light-emitting diodes 11 are defined as the first light-emitting unit 10 and the others are defined as the second light-emitting unit 20; wherein the light-emitting diodes 11 are commonly formed on a substrate 12, for example, by epitaxial growth or bonding to the substrate 12 through an adhesive layer. The first light-emitting unit 10 comprises N numbers of light-emitting diodes 11 and the second light-emitting unit 20 comprises M numbers of light-emitting diodes 11; wherein N≥1; M≥1; and N−M≤3. In this embodiment, the light-emitting diodes 11 are connected in series with each other. Depending on actual requirements, the light-emitting diodes 11 can be connected in parallel or in series-parallel with each other.

Figure 3A:
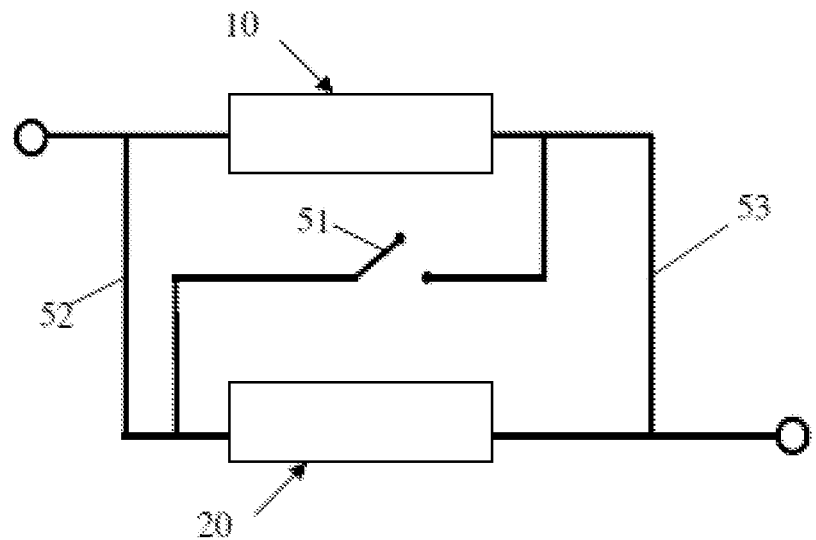
FIGS. 3A and 3B are circuit diagrams of the first embodiment showing the light-emitting units connected in parallel with each other.
Figure 3B:
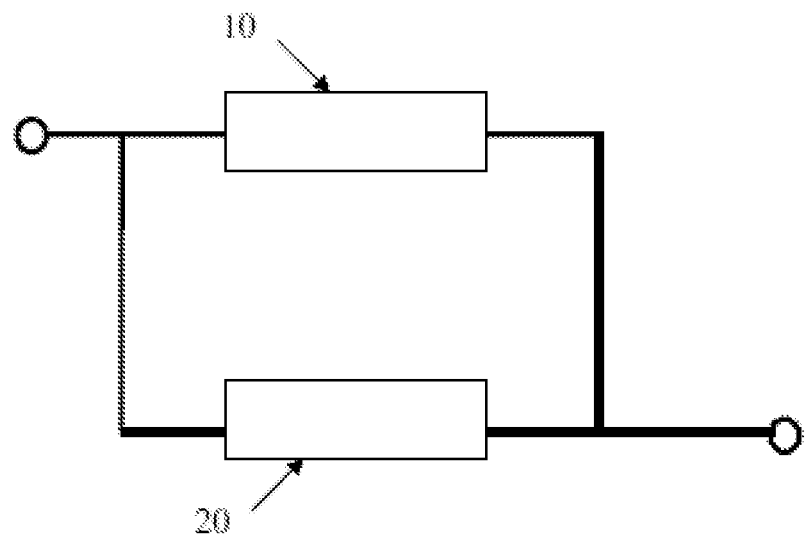
Figure 3C:
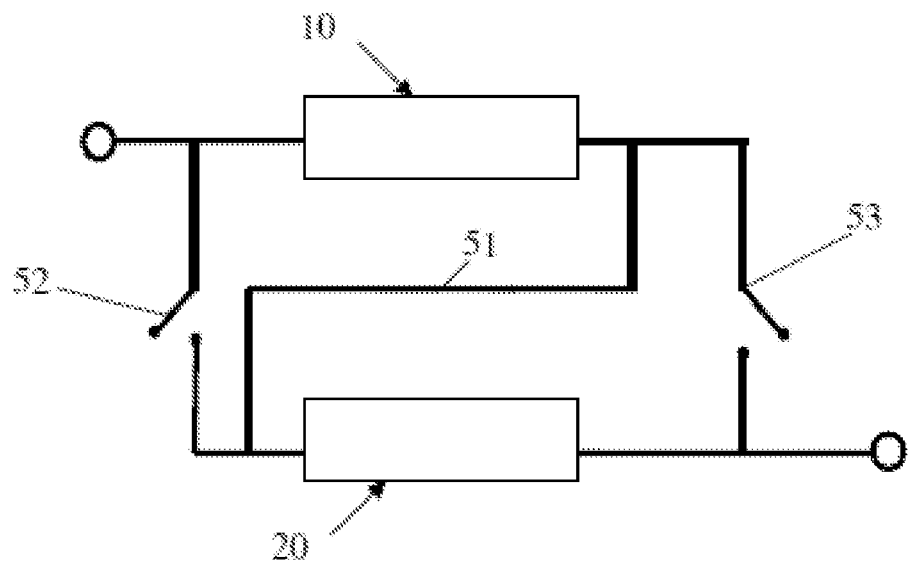
FIGS. 3C and 3D are circuit diagrams of the first embodiment showing the light-emitting units connected in series with each other.
Figure 3D:
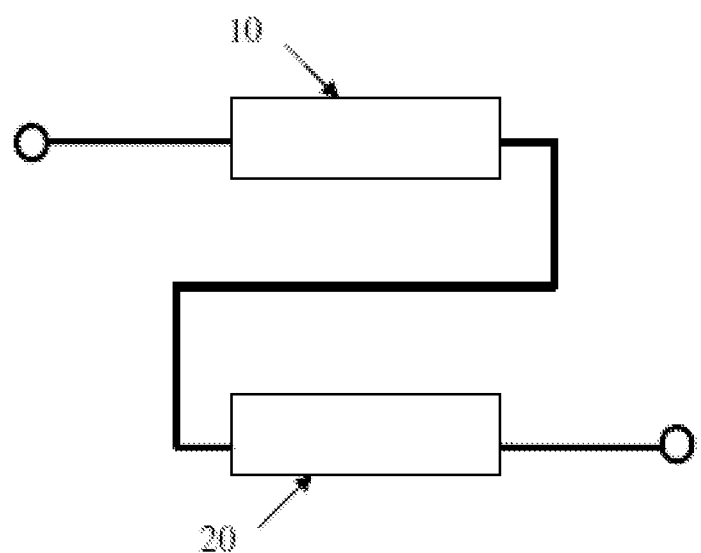

As shown in FIGS. 1A and 3A to 3D, in this embodiment, the periodic voltage signal is a direct current signal having a frequency of 120 Hz and comprises a first voltage signal and a second voltage signal. The first switching unit 5 receives the periodic voltage signal, and serially or parallelly connects the first and second light-emitting units 10, 20 based on the first and second voltage signals. For example, the periodic voltage signal is a sine wave signal having a voltage of 0-155V and a forward voltage of a light-emitting diode at a current of 10 mA is 3V. Each of the first and second light-emitting units 10, 20 comprises twenty light-emitting diodes which are connected in series with each other, and therefore the forward voltage (operation voltage) of each of the first and second light-emitting unit 10, 20 is 60 V. When the switching unit 5 receives the periodic voltage signal and the voltage is raised up to about 60V (the first voltage signal), the first switch 51 of the first switching unit 5 is in an open state and the second and third switches 52, 53 of the first switching unit 5 are in a close state such that the first and second light-emitting units 10, 20 are connected in parallel with each other, as shown in FIGS. 3A and 3B. When the voltage is continuously raised up to about 120V (the second voltage signal), the first switch 51 of the first switching unit 5 is in a close state and the second and third switches 52, 53 of the first switching unit 5 are in an open state such that the first and second light-emitting units 10, 20 are connected in series with each other, as shown in FIGS. 3C and 3D.

Figure 3E:
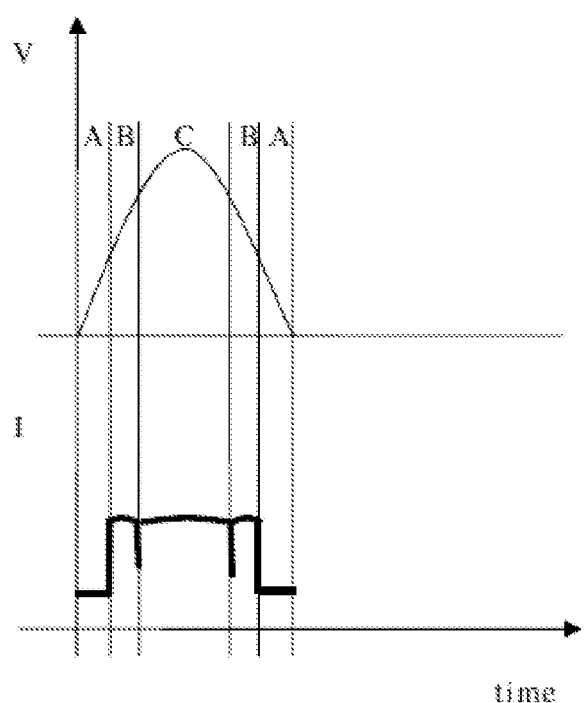
FIG. 3E is a voltage-time and current-time graph of the first embodiment.

FIG. 3E is a voltage-time and current-time graph according to the first embodiment of the present disclosure. Take one period for example, during the voltage of the periodic voltage signal in the range of 0-60V(A), since the voltage does not achieve the operation voltage (60V) of the first and second light-emitting units 10, 20, the first and second light-emitting units 10, 20 do not emit light within this range; when the voltage is continuously raised to a range of 60-120V (B), the first and second light-emitting units 10, 20 are connected in parallel with each other for emitting light; when the voltage is raised to a range of 120-155V (C), the first and second light-emitting units 10, 20 are connected in series with each other for emitting light. Subsequently, when the voltage is up to a peak (155V) and dropping to 120V(155-120V(C)), the first and second light-emitting units 10, 20 are still connected in series with each other for emitting light; when the voltage is continuously dropping to a range of 120-60V(B), the connection of the first and second light-emitting units 10, changes from series connection to parallel connection; finally, during the voltage in a range of 60-0V, since the voltage is less than the operation voltage of the first and second light-emitting units 10, 20, the first and second light-emitting units 10, 20 do not emit light. Accordingly, the first and second light-emitting units 10, 20 emit light during the voltage in the range of 60-155V so the power factor is enhanced. It is noted that the first and second voltage signal are different voltage (for example: 60V and 120V) or different voltage range (for example: 60-120V and 120-155V). In addition, when the periodic voltage signal is a non-rectified alternating current signal, the absolute value of the second voltage signal is greater than that of the first voltage signal.

It is understood that during the voltage in a range of 0-60V (A) or 60-0V (A), the first, second, and third switches 51, 52, 53 of the first switching unit 5 are in an open state. However, according to the design, the second and third switches 52, 53 of the first switching unit 5 can be in a close state during the voltage in a range of 0-60V (A). Therefore, the first and second light-emitting units 10, 20 are connected in parallel with each other during the voltage in a range of 0-120V, but the first and second light-emitting units 10, 20 merely emit light during the voltage in the range of 60-120V. When the voltage is raised up to about 120V, the first switching unit 5 is switched for serially connecting the first and second light-emitting units 10, 20 for emitting light. During the voltage in a range of 0-155V, the first switching unit 5 is only switched once for embodying the first embodiment of the present disclosure.

Figure 4:
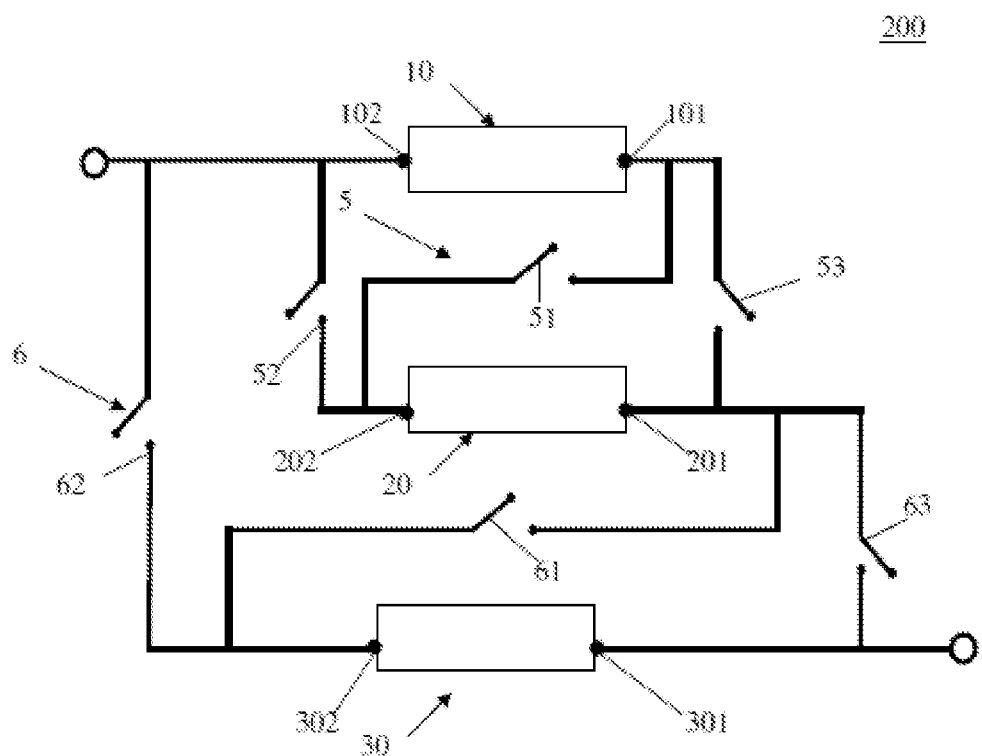
FIG. 4 is a circuit diagram of a light-emitting device in accordance with the second embodiment of the present disclosure.

FIG. 4 discloses a light-emitting device 200 according to the second embodiment of the present disclosure. The light-emitting device 200 further comprises a third light-emitting unit 30 and a second switching unit 6. The third light-emitting unit 30 comprises a first electrical end point 301 and a second electrical end point 302. The second switching unit 6 comprises a first switch 61 connecting the first electrical end point 201 of the second light-emitting unit 20 and the second electrical end point 302 of the third light-emitting unit 30, a second switch 62 connecting the second electrical end points 102, 302 of the first and third light-emitting units 10, 30, and a third switch 63 connecting the first electrical end points 201, 301 of the second and third light-emitting units 20, 30. The periodic voltage signal further comprises a third voltage signal.

Figure 5A:
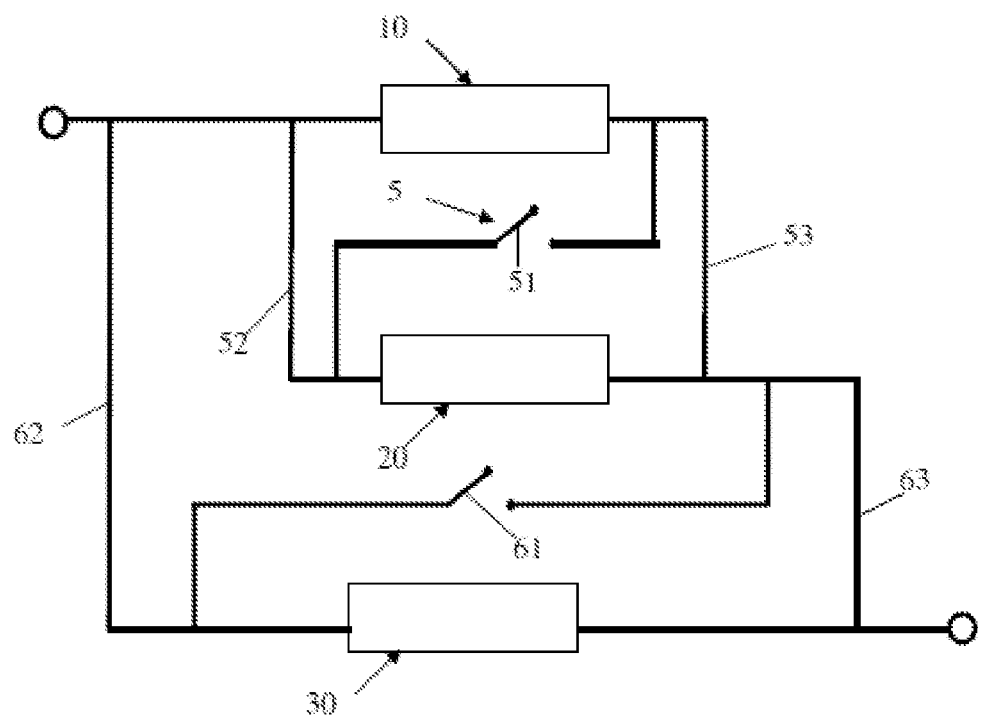
FIGS. 5A and 5B are circuit diagrams of the second embodiment of the present disclosure showing the light-emitting units connected in parallel with each other.
Figure 5B:
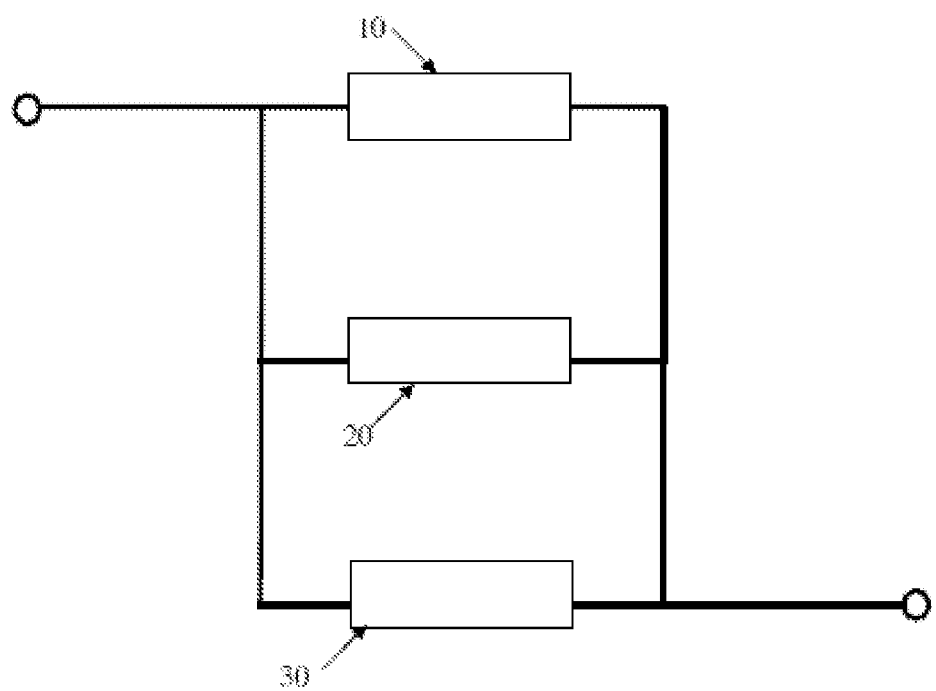
Figure 5C:
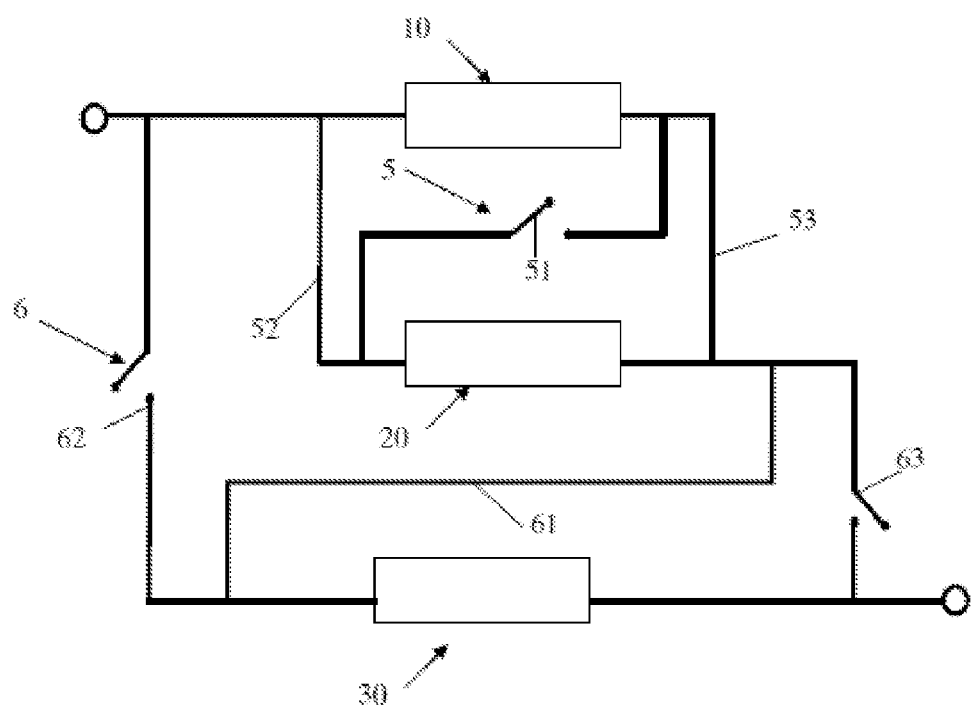
FIGS. 5C and 5D are circuit diagrams of the second embodiment of the present disclosure showing the light-emitting units connected in series-parallel with each other.
Figure 5D:
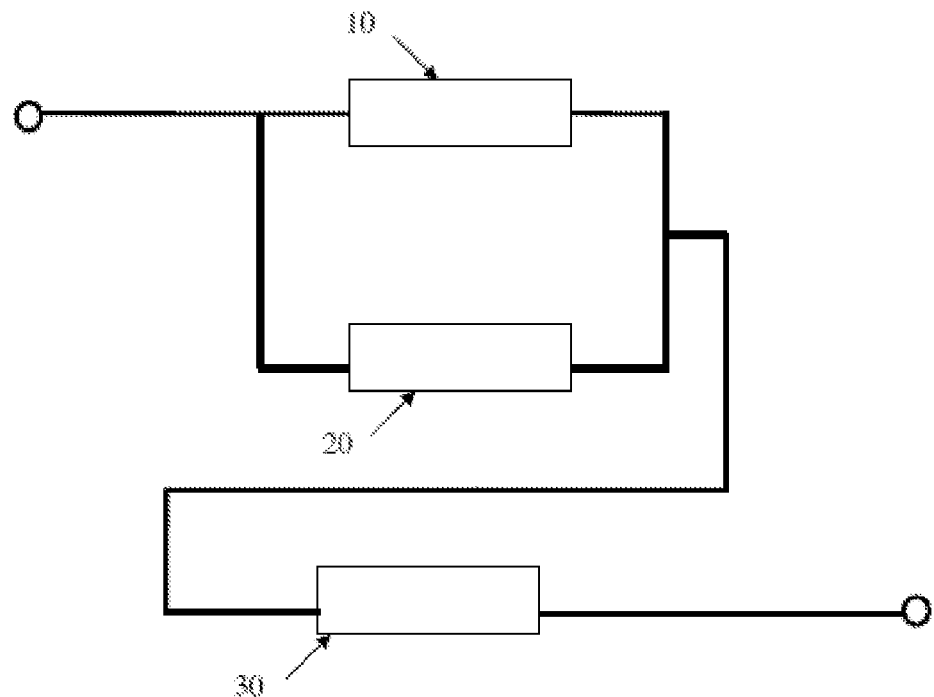
Figure 5E:
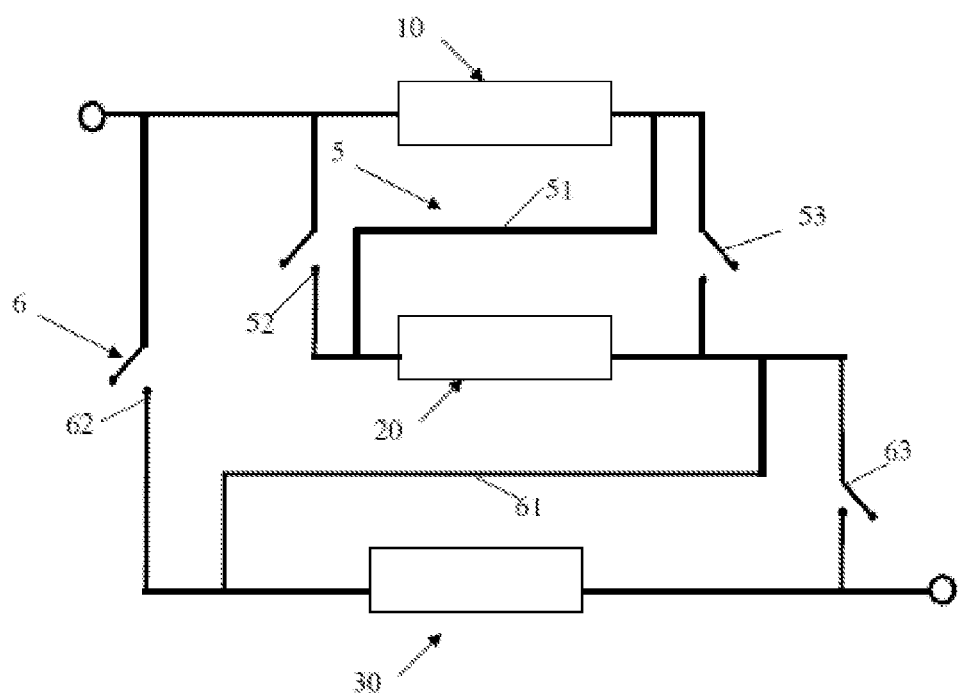
FIGS. 5E and 5F are circuit diagrams of the second embodiment of the present disclosure showing the light-emitting units connected in series with each other.
Figure 5F:
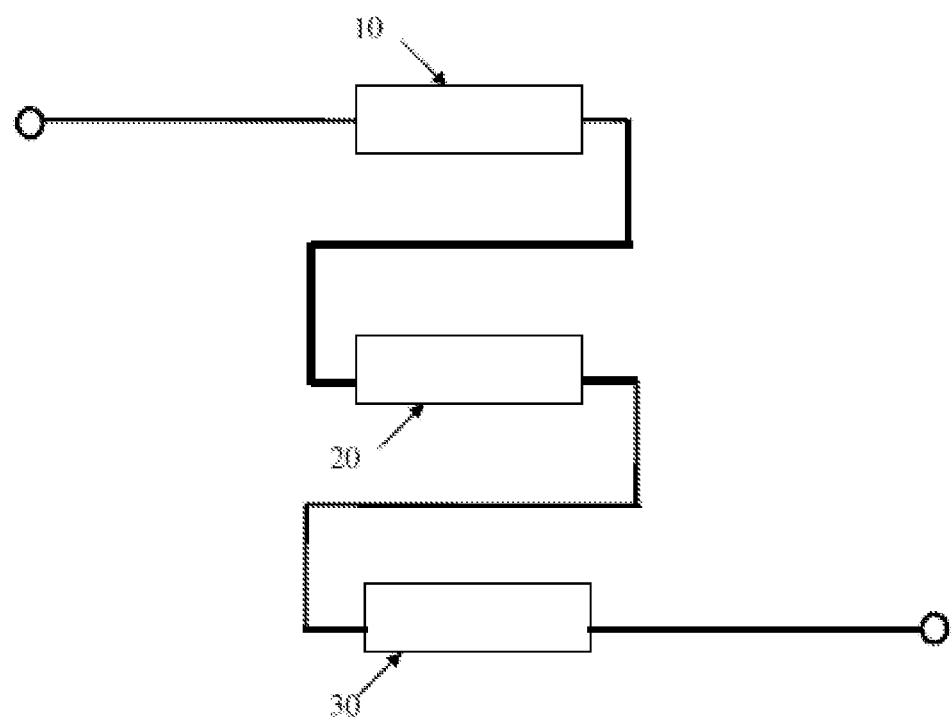

As shown in FIGS. 5A to 5F, in this embodiment, each of the first, second, and third light-emitting units 10, 20, 30 comprises a light-emitting array chip which comprises ten light-emitting diodes 11 connected in series with each other, and the forward voltage of each of the light-emitting diodes 11 at a current of 10 mA is 3V. Therefore the total forward voltage of each of the first, second, and third light-emitting units 10, 20, 30 is 30V. When the first and second switching units 5, 6 receive the periodic voltage signal and the voltage is raised up to about 30V (the first voltage signal), the first switches 51, 61 of the first and second switching units 5, 6 are in an open state and the second and third switches 52, 53, 62, 63 of the first and second switching units 5, 6 are in a close state such that the first, second, and third light-emitting units 10, 20, 30 are connected in parallel with each other (as shown in FIGS. 5A and 5B). Subsequently, when the voltage is continuously raised up to about 60V (the second voltage signal), the first switch 61 of the second switching unit 6 and the second and third switches 52, 53 of the first switching unit 5 are in a close state, and the first switch 51 of the first switching unit 5 and the second and the third switches of the second switching unit 6 are in an open state such that the first and second light-emitting units 10, 20 are connected in parallel with each other, and then is connected in series with the third light-emitting unit 30 (as shown in FIGS. 5C and 5D). When the voltage is continuously raised up to about 90V (the third voltage signal), the first switch 51, 61 of the first and second switching units 5, 6 are in a close state and the second and third switches 52, 53, 62, 63 of the first and second switching units 5, 6 are in an open state such that the first, second, and third light-emitting units 10, 20, 30 are connected in series with each other (as shown in FIGS. 5E and 5F). Similar to the first embodiment, the first, second, and third light-emitting units 10, 20, 30 emit light during the voltage in the range of 30-155V so the power factor is enhanced. It is noted that the first, second and third voltage signals are different voltage (for example: 30V, 60V and 90V) or different voltage range (for example: 30-60V, 60-90V and 90-155V). In addition, when the periodic voltage signal is a non-rectified alternating current signal, the absolute value of the third voltage signal is larger than that of the first and second voltage signals.

Likewise, the second and third switches 52, 53, 62, 63 of the first and second switching units 5, 6 are optionally in an open state or in a close state during the voltage in a range of 0-30V.

Figure 6:
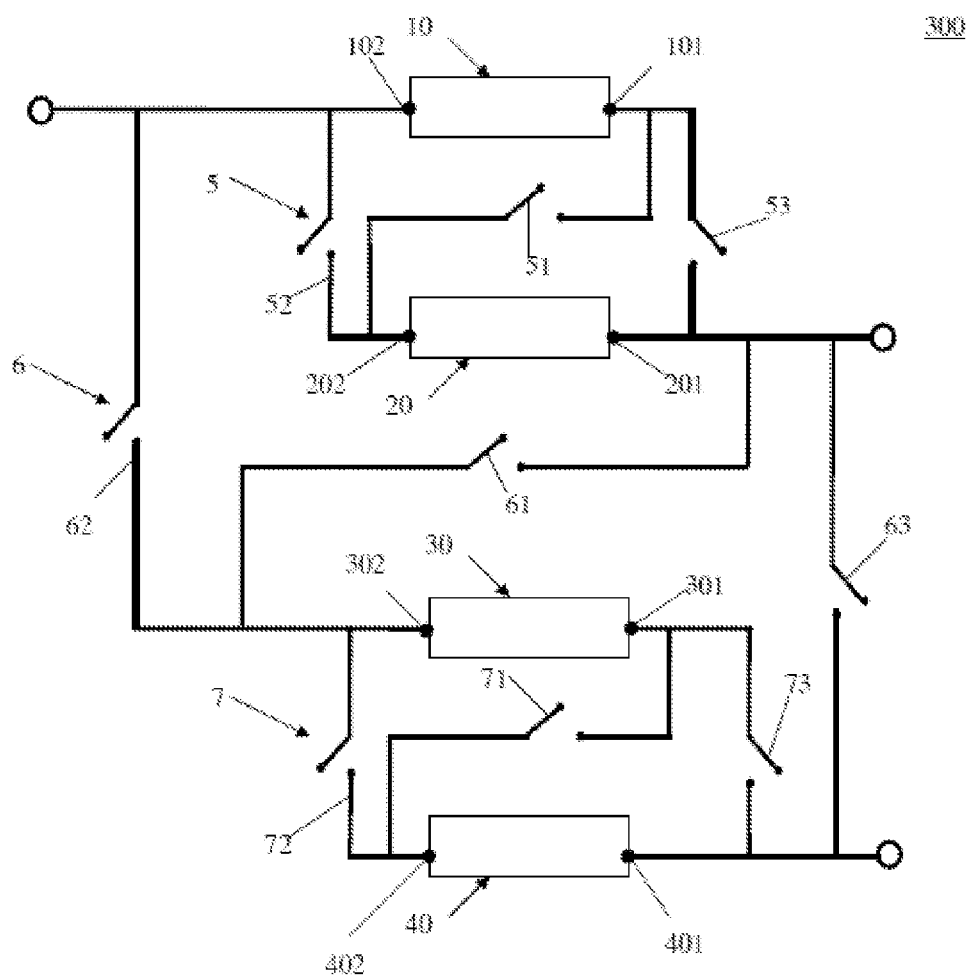
FIG. 6 shows a circuit diagram of a light-emitting device in accordance with the third embodiment of the present disclosure.

FIG. 6 discloses a light-emitting device 300 according to the third embodiment of the present disclosure. The light-emitting device 300 further comprises a four light-emitting unit 40 and a third switching unit 7. The fourth light-emitting unit 40 comprises a first electrical end point 401 and a second electrical end point 402. The third switching unit 7 comprises a first switch 71 connecting the first electrical end point 301 of the third light-emitting unit 30 and the second electrical end point 402 of the fourth light-emitting unit 40, a second switch 72 connecting the second electrical end points 302, 402 of the third and fourth light-emitting units 30, 40, and a third switch 73 connecting the first electrical end points 301, 401 of the third and fourth light-emitting units 30, 40. In addition, the third switch 63 of the second switching unit 6 connecting the first electrical end points 201, 401 of the second and fourth light-emitting units 20, 40.

Figure 7A:
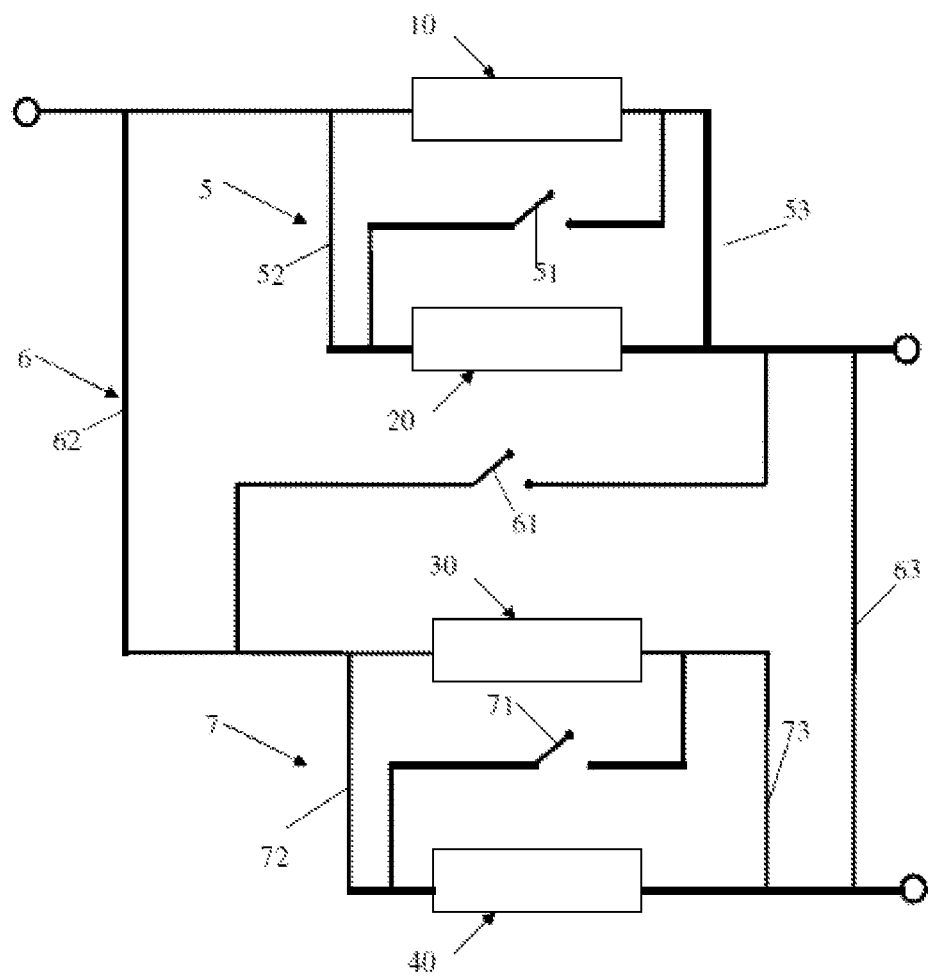
FIGS. 7A and 7B are circuit diagrams of the third embodiment of the present disclosure showing the light-emitting units connected in parallel with each other.
Figure 7B:
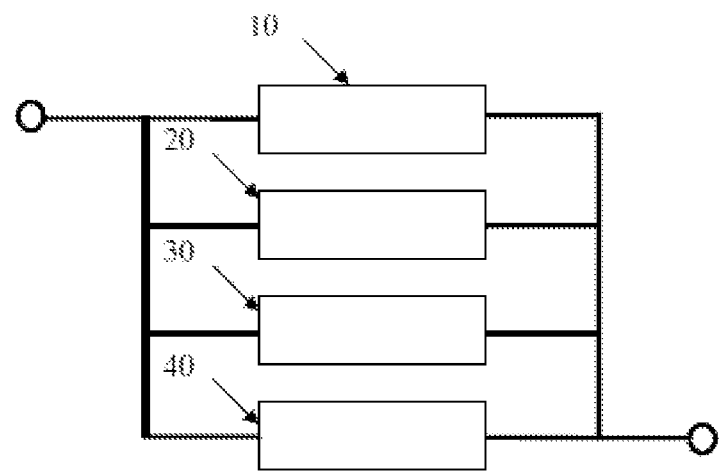
Figure 7C:
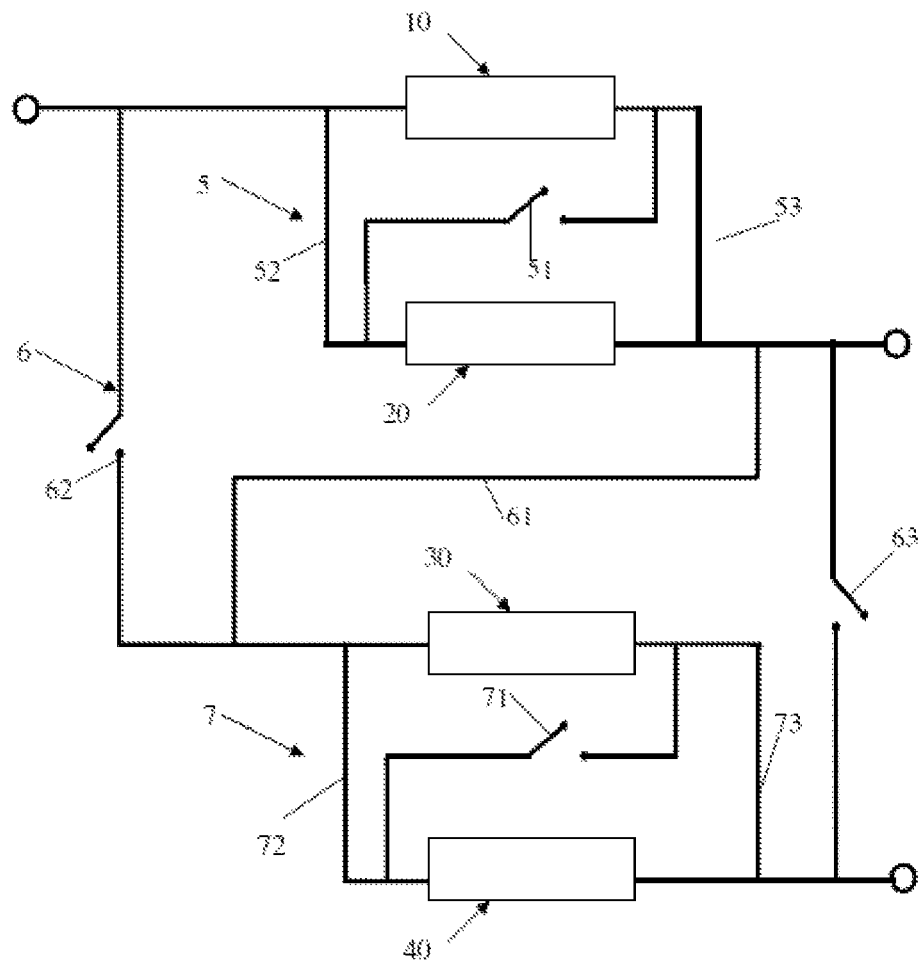
FIGS. 7C and 7D are circuit diagrams of the third embodiment of the present disclosure showing the light-emitting units connected in series-parallel with each other.
Figure 7D:
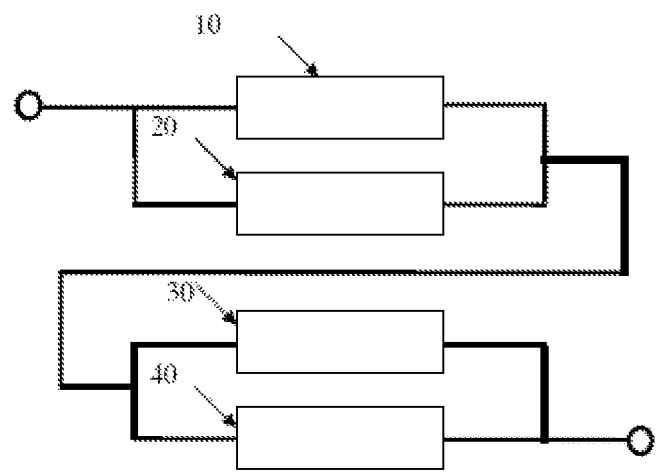
Figure 7E:
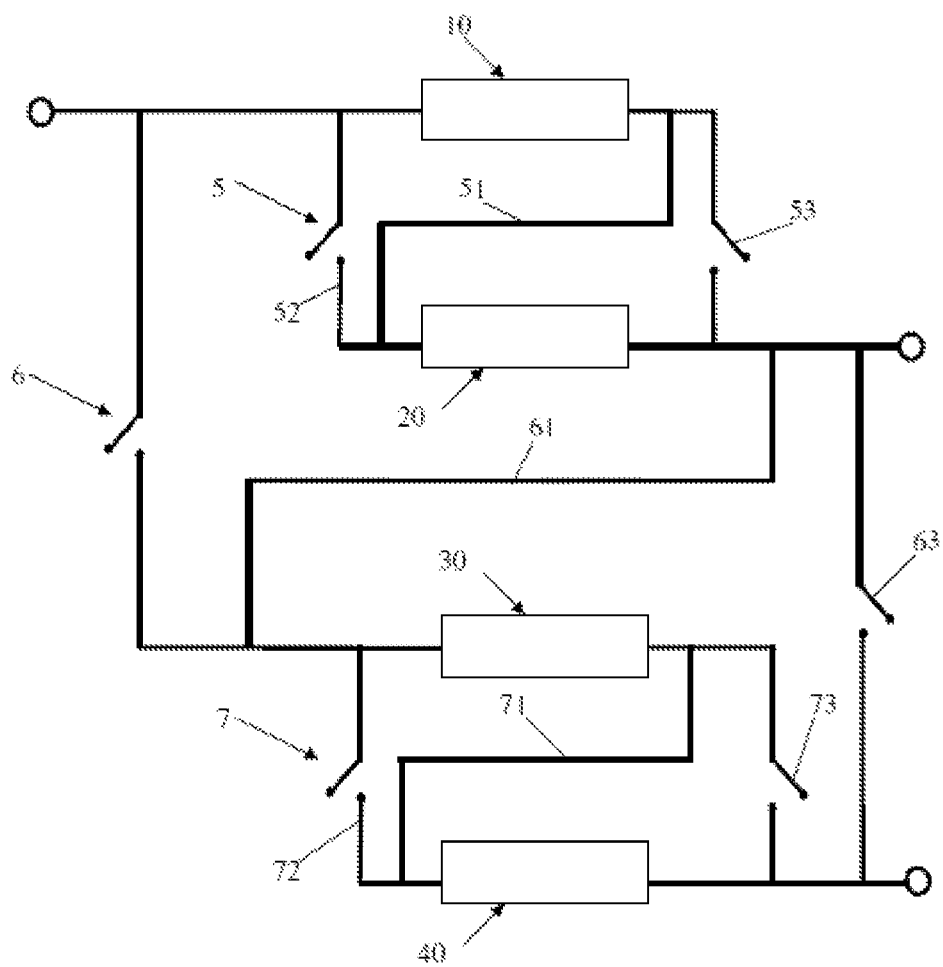
FIGS. 7E and 7F are circuit diagrams of the third embodiment of the present disclosure showing the light-emitting units connected in series with each other.
Figure 7F:
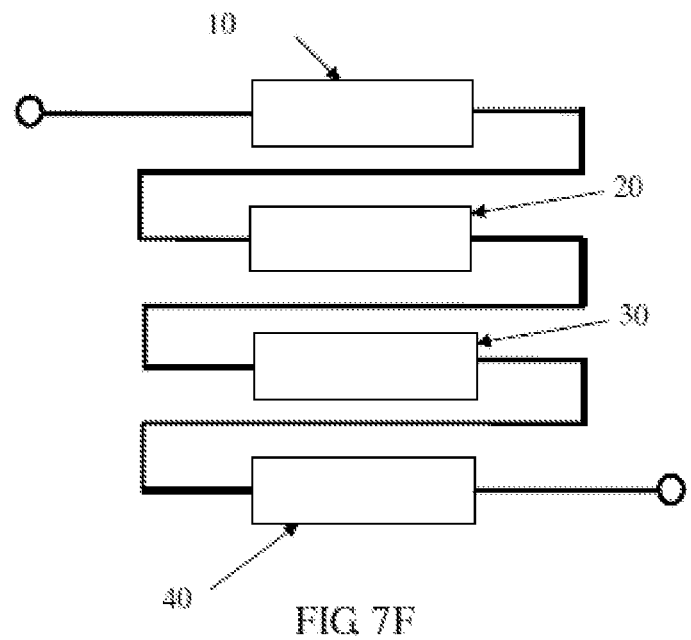

As shown in FIGS. 7A to 7F, in this embodiment, the periodic voltage signal is a sine wave signal having a voltage of 0-311V. Each of the first, second, third, and fourth light-emitting units 10, 20, 30, 40 comprises a light-emitting array chip which comprises seventeen light-emitting diodes 11 connected in series with each other, and the forward voltage of each of the light-emitting diodes 11 at a current of 10 mA is 3V. Therefore, the total forward voltage of each of the first, second, third, and fourth light-emitting units 10, 20, 30, 40 is 51V. When the first, second, and third switching units 5, 6, 7 receive the periodic voltage signal and the voltage is raised up to about 51V (the first voltage signal), the first switches 51, 61, 71 of the first, second, and third switching units 5, 6, 7 are in an open state and the second and third switches 52, 53, 62, 63, 72, 73 of the first, second, and third switching units 5, 6, 7 are in a close state such that the first, second, third, and fourth light-emitting units 10, 20, 30, 40 are connected in parallel with each other (as shown in FIGS. 7A and 7B). Subsequently, when the voltage is continuously raised up to about 102V (the second voltage signal), the second and third switches 52, 53, 72, 73 of the first and third switching units 5, 7 and the first switch 61 of the second switching unit 6 are in a close state, and the first switches 51, 71 of the first and third switching units 5, 7 and the second and third switches 62, 63 of the second switching unit 6 are in an open state such that the first and second light-emitting units 10, 20 are connected in parallel with each other, and the third and fourth light-emitting units 30, 40 are connected in parallel with each other, and then are connected in series with each other (this connection is called "two parallel then serial" hereinafter and as shown in FIGS. 7C and 7D). When the voltage is continuously raised up to about 204V (the third voltage signal), the first switches 51, 61, 71 of the first, second, and third switching units 5, 6, 7 are in a close state and the second and third switches 52, 53, 62, 63, 72, 73 of the first, second, and third switching units 5, 6, 7 are in an open state such that the first, second, third, and fourth light-emitting units 10, 20, 30, 40 are connected in series with each other (as shown in FIGS. 7E and 7F).

Figure 7G:
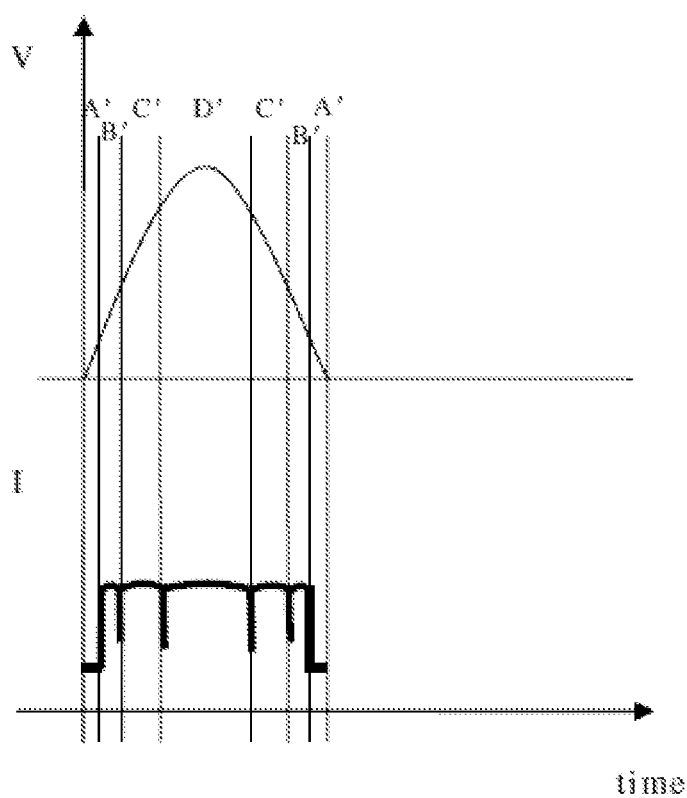
FIG. 7G is a voltage-time and current-time graph of the third embodiment.

FIG. 7G is a voltage-time and current-time graph according to the third embodiment of the present disclosure. Take one period for example, during the voltage of the periodic voltage signal in the range of 0-51V(A'), since the voltage does not achieve the operation voltage of the light-emitting units 10, 20, 30, 40, the light-emitting units 10, 20, 30, 40 do not emit light within this range; when the voltage is continuously raised to a range of 51-102V (B'), the light-emitting units 10, 20, 30, 40 are connected in parallel with each other for emitting light; when the voltage is raised to a range of 102-204V (C'), the light-emitting units 10, 20, 30, 40 are connected in the connection of two parallel then serial for emitting light; when the voltage is raised to a range of 204-311V (D'), the light-emitting units 10, 20, 30, 40 are connected in series with each other for emitting light. When the voltage is up to a peak (311V) and drops to 204V (311-204V (D')), the light-emitting units 10, 20, 30, 40 are still connected in series with each other for emitting light; when the voltage is continuously dropping to a range of 204-102V (C'), the connection of the light-emitting units 10, 20, 30, 40 changes from series connection to two parallel then serial connection; when the voltage is continuously dropping to a range of 102-51V (B'), the connection of the light-emitting units 10, 20, 30, 40 changes from two parallel then serial connection to parallel connection; finally, during the voltage in a range of 51-0V(A'), the voltage is less than the operation voltage of the light-emitting units 10, 20, 30, 40, the light-emitting units 10, 20, 30, 40 do not emit light. Accordingly, the first, second, third, and fourth light-emitting units 10, 20, 30, 40 emit light during the voltage in the range of 51-311V so the power factor is enhanced.

Likewise, the second and third switches 52, 53, 62, 63, 72, 73 of the first, second, and third switching units 5, 6, 7 are optionally in an open state or in a close state during the voltage in a range of 0-51V.

It is noted that when the periodic voltage signal is a sine wave signal having a voltage of 0-155V, the light-emitting units 10, 20, 30, 40 are connected in parallel with each other during the voltage in a range of 51-102V; the light-emitting units 10, 20, 30, 40 are connected in the connection of two parallel then serial during the voltage in a range of 102-155V. However, there is no series connection of the light-emitting units 10, 20, 30, 40 during the voltage in a range of 0-155V. That is, even in the third embodiment, there are three types of connections of the light-emitting units 10, 20, 30, 40. But for mating with the operation voltage, the connection of the light-emitting units 10, 20, 30, 40 is not necessary to be three types, and is adjustable depending on the actual requirements.

Figure 8:
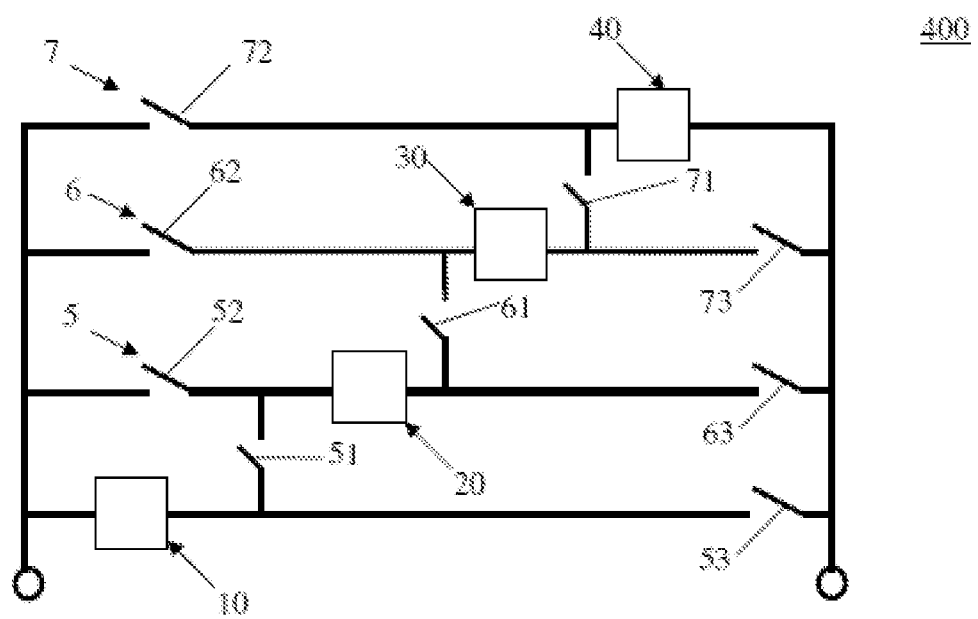
FIG. 8 shows a circuit diagram of a light-emitting device in accordance with the fourth embodiment of the present disclosure.
Figure 9A:
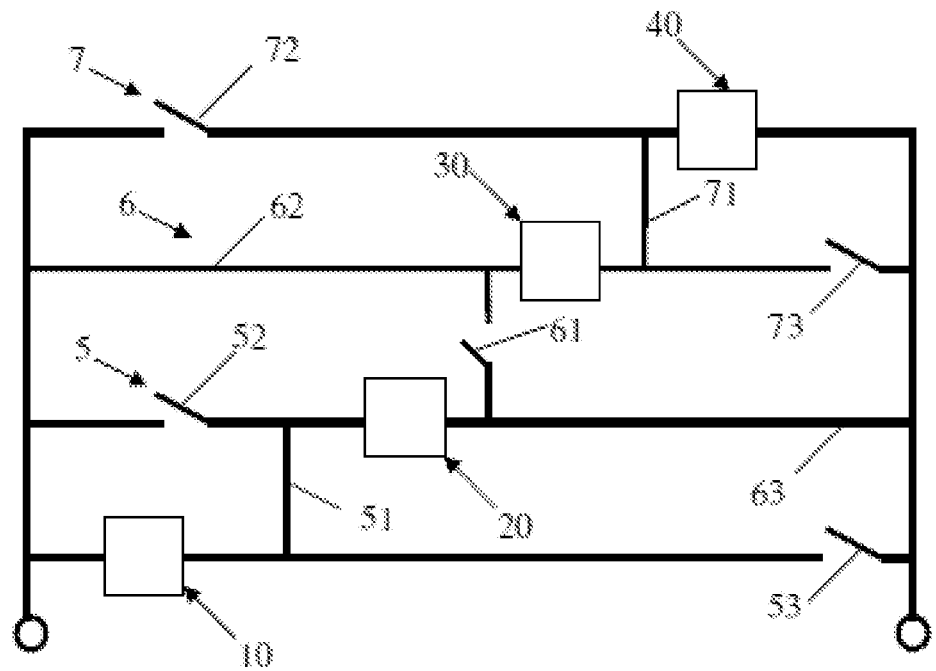
FIGS. 9A and 9B are circuit diagrams of the fourth embodiment of the present disclosure showing the light-emitting units connected in series-parallel with each other.
Figure 9B:
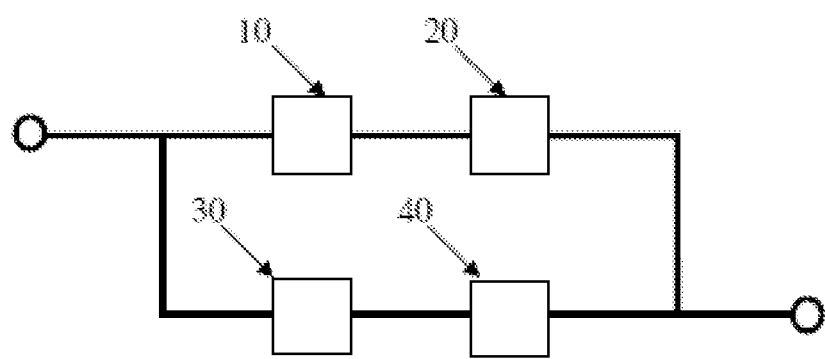

FIG. 8 discloses a light-emitting device 400 according to the fourth embodiment of the present disclosure. The fourth embodiment of the light-emitting device 400 has the similar structure with the third embodiment of the light-emitting device 300, except that the circuit configuration between the light-emitting units and the switching units. Due to the different circuit configuration, when the voltage is up to about 102V (the second voltage signal), the first switches 51, 71 of the first and third switching units 5, 7 and the second and third switches 62, 63 of the second switching unit 6 are in a close state, and the other switches 52, 53, 61, 72, 73 are in an open state such that the first and second light-emitting units 10, 20 are connected in series with each other, the third and fourth light-emitting units 30, 40 are connected in series with each other, and then are connected in parallel with each other (as shown in FIGS. 9A and 9B).

It is noted that the number of the light-emitting units are not limited to two, three, or four in this disclosure, and the serial or parallel connection of the light-emitting units is not limited to the above described connection. The number of the light-emitting unit can be chosen based on requirements and each light-emitting unit can comprises a suitable number of the light-emitting diodes. Besides, the switching units with a suitable number are provided for electrical connecting with the light-emitting units. For a desired design, the switching units are switchable to different states according the periodic voltage signal, which results in the light-emitting units connected in different connections with the different states of the switching units. Furthermore, the light-emitting units all emit light in these connections so the power factor is improved. Preferably, the number of the light-emitting unit is X; X is a positive integer and the total number of factors of X is Y (for example, X=4, the factors of 4 is 1, 2, 4, therefore Y=3); Y≥2. The connection of the light-emitting units comprises at least two types of connections, preferably, comprising Y types of connections. The periodic voltage signal comprises Y numbers of different voltage signals. The number of the switching units comprises at least (X−1), and each of the switching units comprises at least three switches, that is the number of the switches in total is 3*(X−1). Within the 3*(X−1) switches, there are (X−1) light-emitting diodes connecting a first electrical end point of one light-emitting unit and a second electrical end point of the adjacent one light-emitting unit.

In another embodiment, for example, a single blue light-emitting diode has a forward voltage of about 2.8-3.2V at a current of 10 mA. When operating at a root mean square voltage of 110V, the light-emitting units are connected in one connecting type during the first voltage signal having a voltage in the range of 35-80V, and connected in another connecting type during the second voltage signal having a voltage in the range of 70-150V. When operating at a root mean square voltage of 220V, the light-emitting units are connected in one connecting type during the first voltage signal having a voltage in the range of 35-80V, and connected in another connecting type during the second voltage signal having a voltage in the range of 70-150V, and connected in the other connecting type during the third voltage signal having a voltage in the range of 140-280V.

In another embodiment, for example, a single red light-emitting diode has a forward voltage of about 1.8-2.5V at a current of 15 mA. When operating at a root mean square voltage of 110V, the light-emitting units are connected in one connecting type during the first voltage signal having a voltage in the range of 27-78V, and connected in another connecting type during the second voltage signal having a voltage in the range of 54-150V. When operating at a root mean square voltage of 220V, the light-emitting units are connected in one connecting type during the first voltage signal having a voltage in the range of 27-78V, and connected in another connecting type during the second voltage signal having a voltage in the range of 54-150V, and connected in the other connecting type during the third voltage signal having a voltage in the range of 108-300V.

Figure 10A:
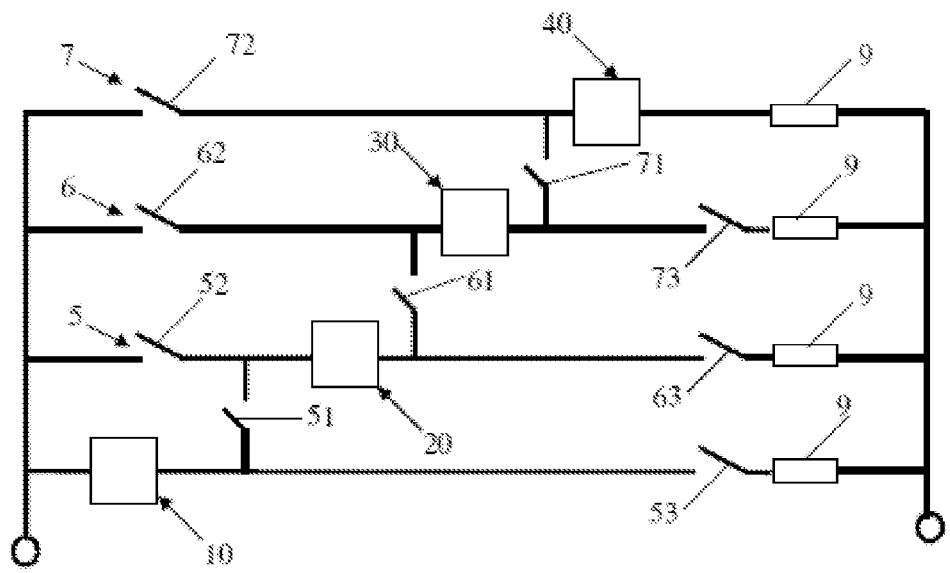
FIG. 10A shows a circuit diagram of a light-emitting device in accordance with the fifth embodiment of the present disclosure.
Figure 10B:
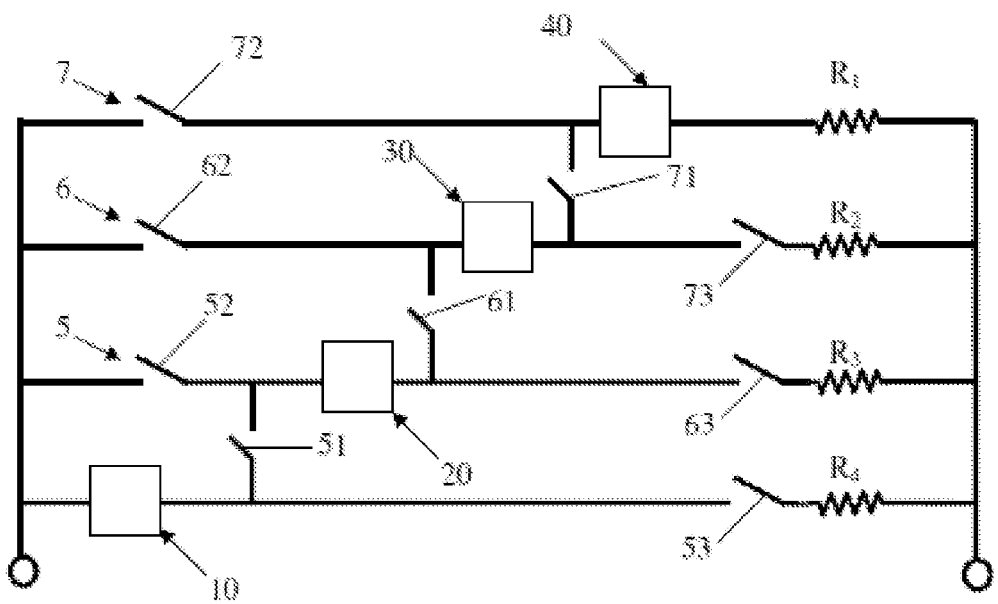
FIG. 10B is a circuit diagram of the fifth embodiment showing that a current-limiting unit is a fixed resistor.
Figure 10C:
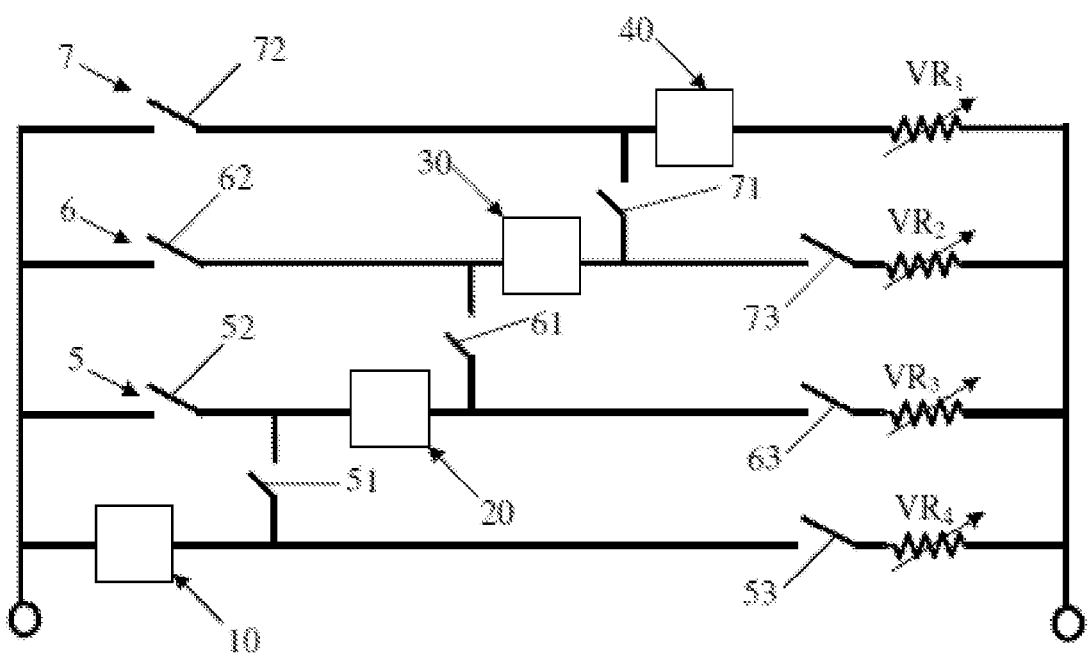
FIG. 10C is a circuit diagram of the fifth embodiment showing that a current-limiting unit is a variable resistor.

FIG. 10A discloses a light-emitting device 500 according to the fifth embodiment of the present disclosure. The light-emitting device 500 further comprises a current-limiting unit 9. In this embodiment, each light emitting unit is connected in series with a current-limiting unit 9 and the current-limiting unit 9 can be a fixed resistor (see FIG. 10B) or a variable resistor (see FIG. 10B). The current-limiting unit 9 can also comprises bipolar junction transistor (BJT), power bipolar junction transistor, metal-oxide-semiconductor field-effect transistor (MOSFET), power metal-oxide-semiconductor field-effect transistor, silicon controlled rectifier (SCR), insulated gate bipolar transistor (IGBT), capacitor or inductor. The current-limiting unit is provided for uniformly distributing current or/and dimming.

Figure 11A:
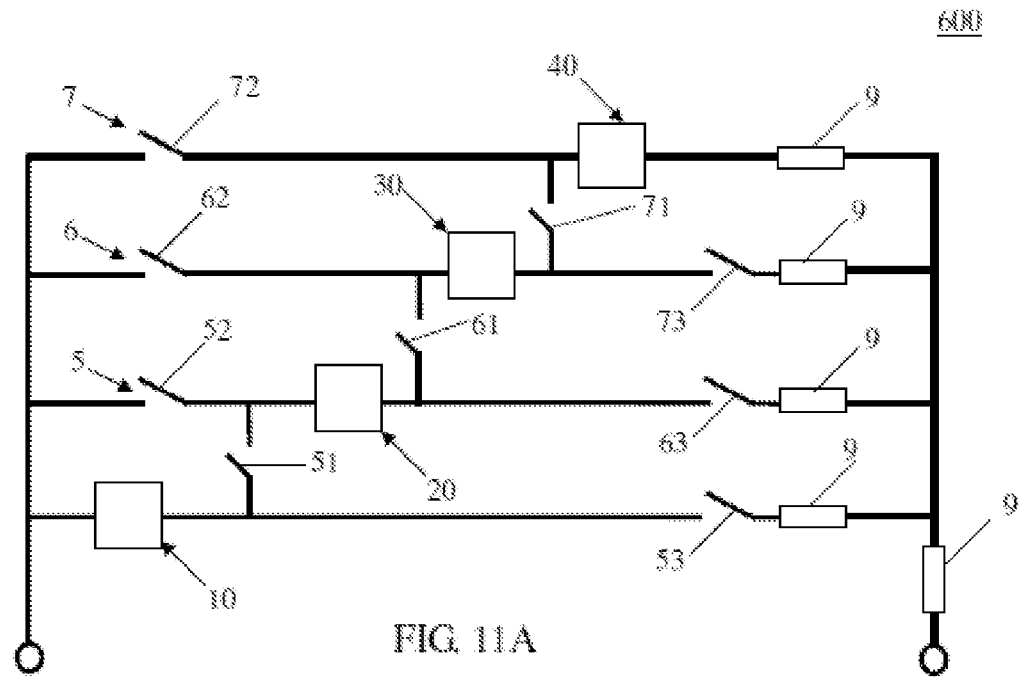
FIGS. 11A and 11B show a circuit diagram of a light-emitting device in accordance with the sixth embodiment of the present disclosure.
Figure 11B:
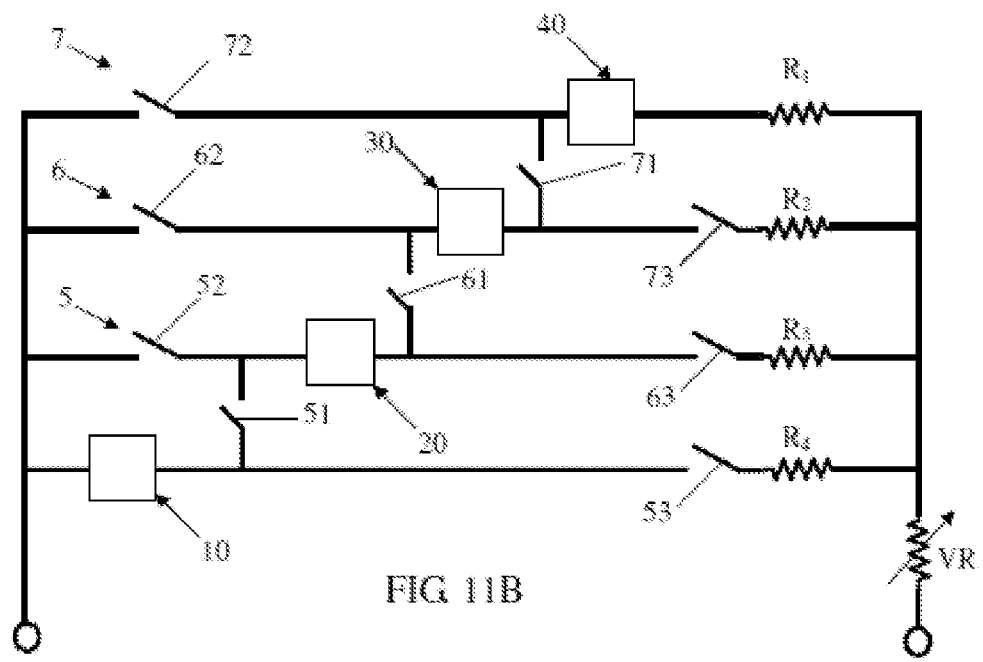

FIG. 11A discloses a light-emitting device 600 according to the sixth embodiment of the present disclosure. The sixth embodiment of the light-emitting device 600 has the similar structure with the fifth embodiment of the light-emitting device 500, except that the light-emitting units 10, 20, 30, 40 are respectively connected in series with a current-limiting unit 9, thereafter is connected in series with another current-limiting unit 9. In this embodiment, the current-limiting unit 9 connected in series with each light-emitting units 10, 20, 30, 40 is a fixed resistor, and the another current-limiting unit 9 is a variable resistor (as shown in FIG. 11B). In this embodiment, the purpose of connecting with the fixed resistor is to uniform distributing current and the purpose of connecting with the variable resistor is to adjust the current through the light-emitting units 10, 20, 30, 40 for dimming.

Figure 12A:
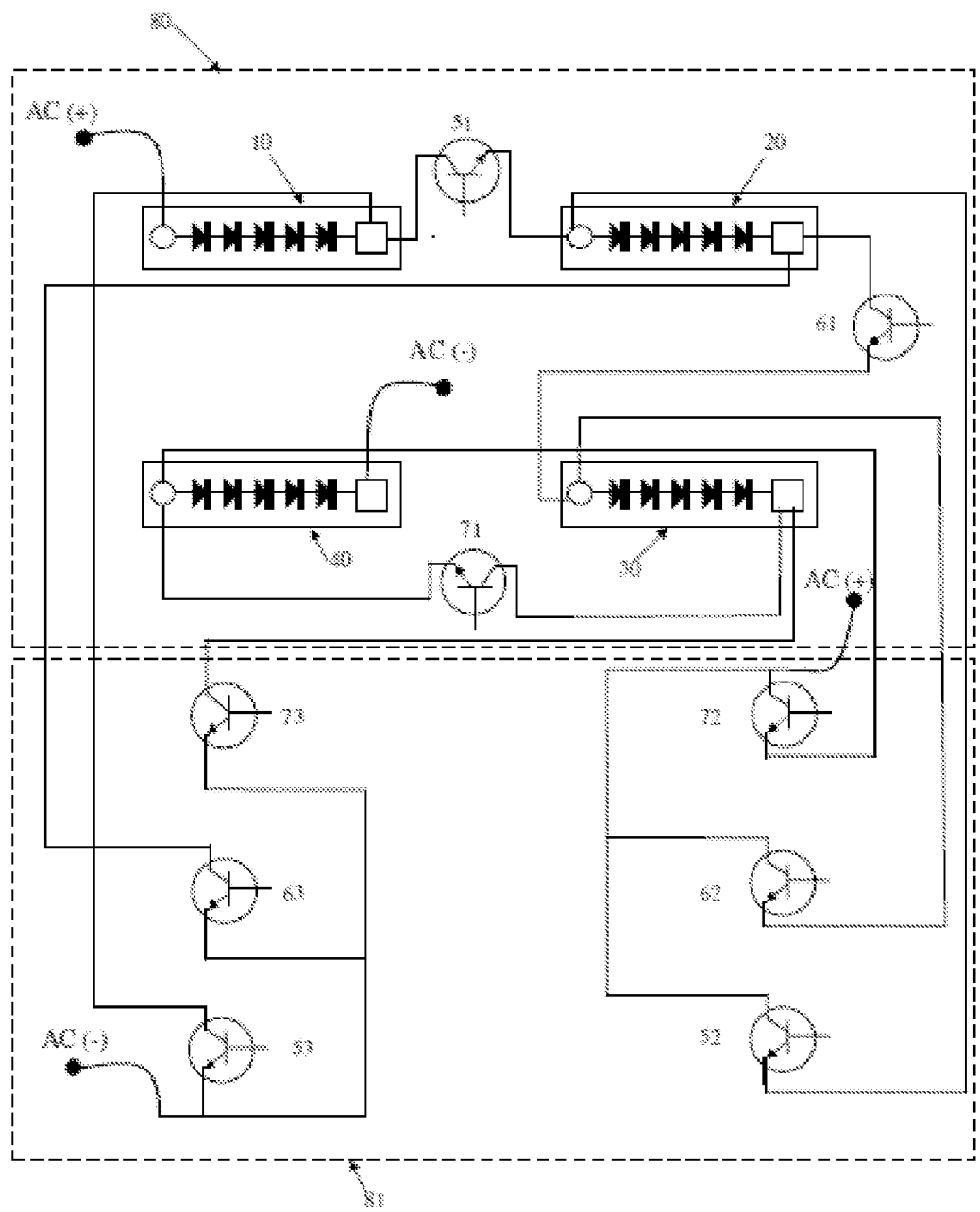
FIG. 12A shows a circuit layout of the fourth embodiment.
Figure 12B:
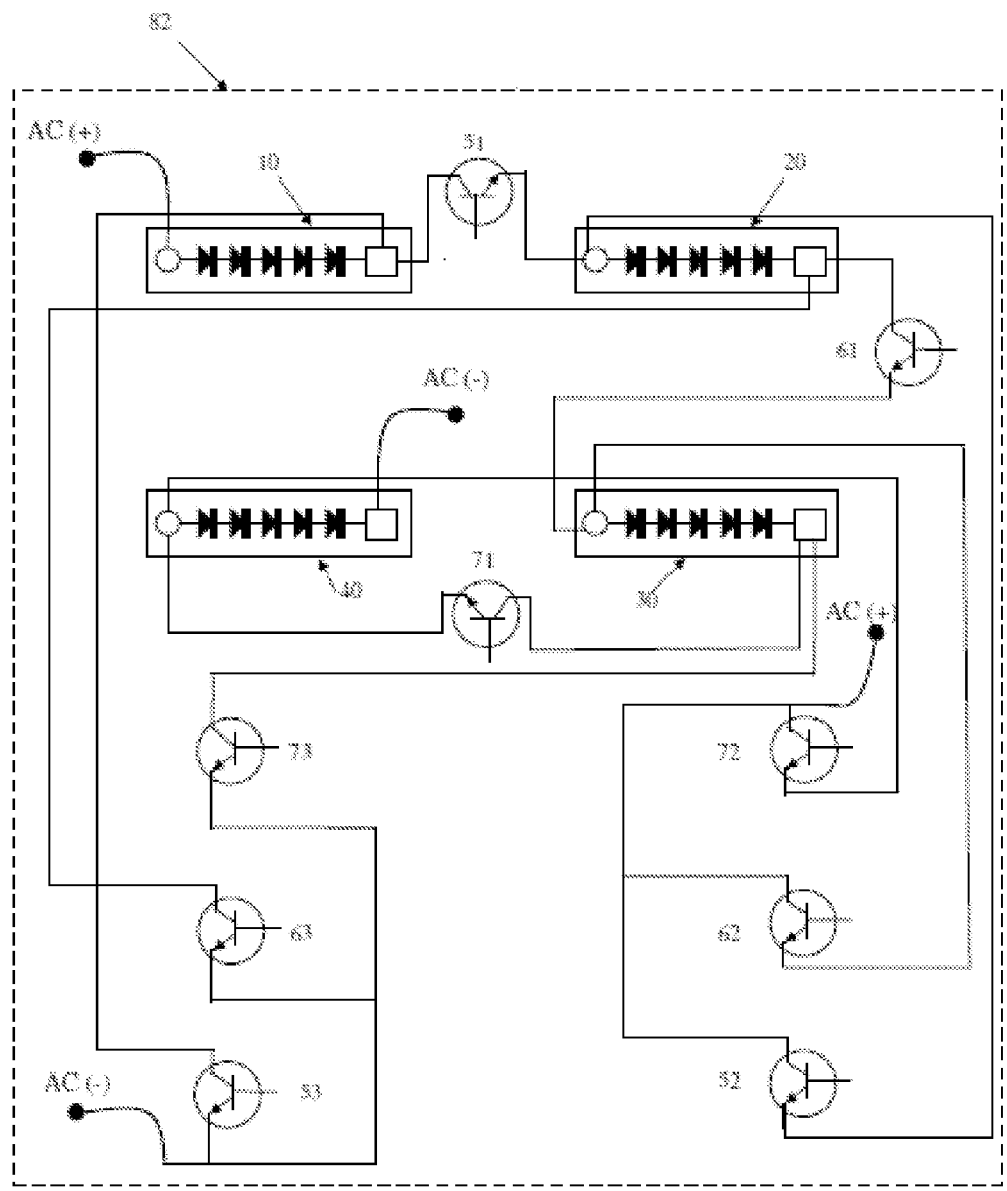
FIG. 12B shows another circuit layout of the fourth embodiment.

FIG. 12A discloses a light-emitting device 400 according to the fourth embodiment of the present disclosure. Each of the switches 51, 52, 53, 61, 62, 63, 71, 72, 73 comprises a bipolar junction transistor (BJT). The light-emitting units 10, 20, 30, 40 and the first switches 51, 61, 71 of the switching units 5, 6, 7 are commonly formed on a carrier 80, and the other switches 52, 53, 62, 63, 72, 73 are commonly formed on another carrier 81 and electrically connected with the light-emitting units 10, 20, 30, 40 and the first switch 51, 61, 71 through conductive lines. Alternatively, as shown in FIG. 12B, the light-emitting units 10, 20, 30, 40 and the switching units 5, 6, 7 are commonly formed on a carrier 82. In this embodiment, the light-emitting units 10, 20, 30, 40 are mounted on the carrier by flip-chip technology or surface mounting technology (SMT). In another embodiment, the light-emitting units 10, 20, 30, 40 are vertically formed on the switching units 5, 6, 7 and electrical connected with each other using a connecting region (not shown). In one embodiment, the switching units 5, 6, 7 can comprises diode, bipolar junction transistor (BJT), power bipolar junction transistor, hetero-bipolar junction transistor (BJT), metal-oxide-semiconductor field-effect transistor (MOSFET), power metal-oxide-semiconductor field-effect transistor, high electron mobility transistor (HEMT), silicon controlled rectifier (SCR), insulated gate bipolar transistor (IGBT), capacitor, or inductor. Furthermore, the switching unit can comprises a converter for converting the waveform of the periodic voltage signal. For example, a sine wave is converted into a square wave or a sawtooth wave for inputting to the switch (BJT). The carrier comprises printed circuit board (PCB). The substrate of the printed circuit board comprises metal, thermoplastic material, thermosetting material or ceramic material. The metal comprises Al or Cu. The thermosetting material comprises phonetic, epoxy, bismaleimide triazine, or combinations thereof. The thermoplastic material comprises polyimide resin or polytetrafluorethylene. The ceramic material comprises $Al_2O_3$, AlN, or AlSiC.

Figure 13A:
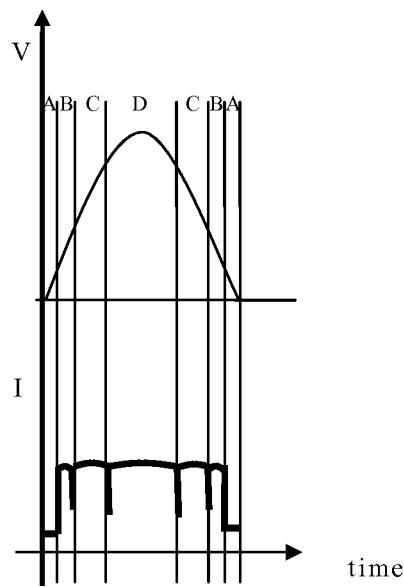
FIGS. 13A to 13E show voltage-time and current-time graphs of the third embodiment indicating the brightness of the light-emitting units can be adjusted by the lighting time.
Figure 13B:
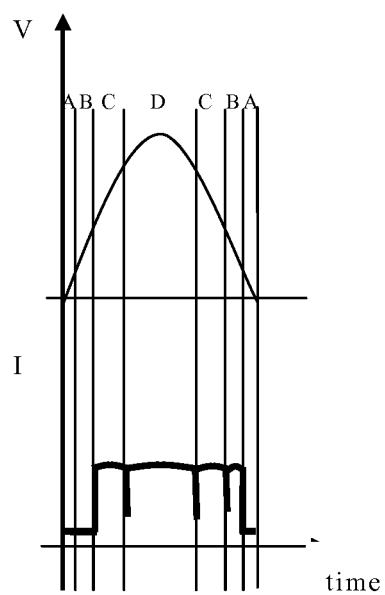
Figure 13C:
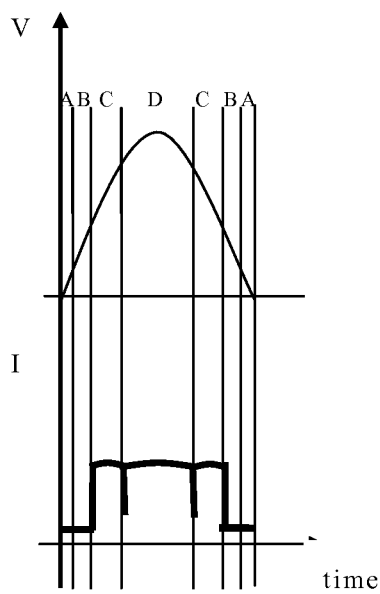
Figure 13D:
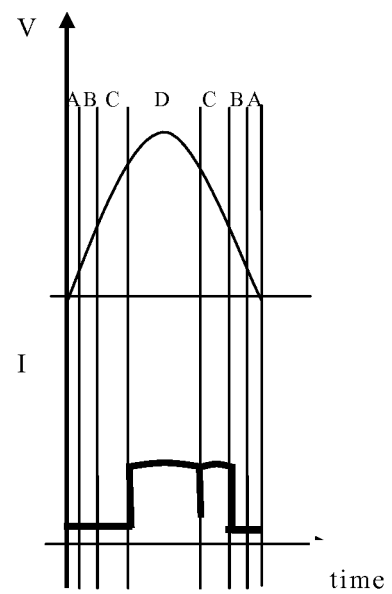
Figure 13E:
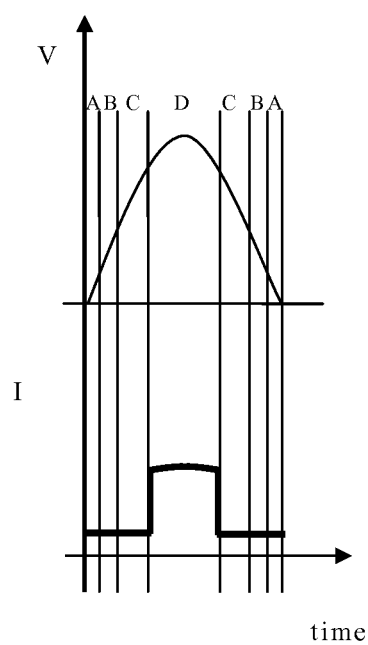

FIGS. 13A to 13E show voltage-time and current-time graph according to the third embodiment of the present disclosure. By adjusting the lighting time, the brightness level of the light-emitting device 300 is five (levels 1-5, level 5 is the highest brightness and level 1 is the lowest brightness). In FIG. 13A, the light-emitting units 10, 20, 30, 40 emit light during the voltage in the range of 51-311-51V (B, C, D, C, B), wherein it is highest brightness level (level 5) in FIGS. 13A to 13E. In FIG. 13B, the light-emitting units 10, 20, 30, 40 emit light during the voltage in the range of 102-311-51V (C, D, C, B), wherein it is the high brightness level (level 4) in FIGS. 13A to 13E. In FIG. 13C, the light-emitting units 10, 20, 30, 40 emit light during the voltage in the range of 102-311-102V (C, D, C), wherein it is the middle brightness level (level 3) in FIGS. 13A to 13E. In FIG. 13D, the light-emitting units 10, 20, 30, 40 emit light during the voltage in the range of 204-311-102V (D, C), wherein it is the low brightness level (level 2) in FIGS. 13A to 13E. In FIG. 13E, the light-emitting units 10, 20, 30, 40 emit light during the voltage in the range of 204-311-204V (D), wherein it is the lowest brightness level (level 1) in FIGS. 13A to 13E. By adjusting the lighting time, the light-emitting device 300 of the present disclosure is capable of being dimmed. It is noted that in FIGS. 13A to 13E, the brightness levels of the light-emitting units 10, 20, 30, 40 are different, but when the light-emitting units 10, 20, 30, 40 emit light, all the light-emitting diodes 11 emit light. Depending on the actual requirements, the light-emitting device 300 can be designed to have two, three, or four brightness levels.

The substrate 12 comprises GaAs, GaP, sapphire, SiC, GaN, or AlN. The light-emitting diode 11 comprises a first semiconductor layer, a second semiconductor layer, and an active layer. The first and second semiconductor layers and the active layer comprise at least one element selected from the group comprising Al, Ga, In, N, P, and As, for example, AlGaInP, AlN, GaN, AlGaN, InGaN or AlInGaN.

Figure 14A:
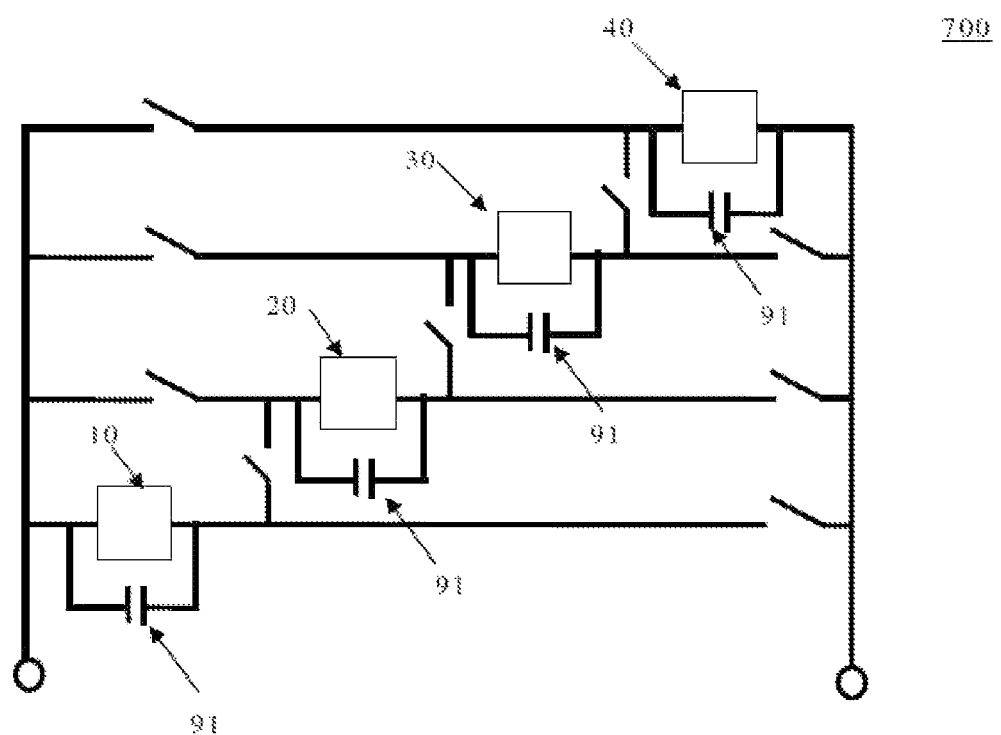
FIG. 14A shows a circuit diagram of a light-emitting device in accordance with the seventh embodiment of the present disclosure.
Figure 14B:
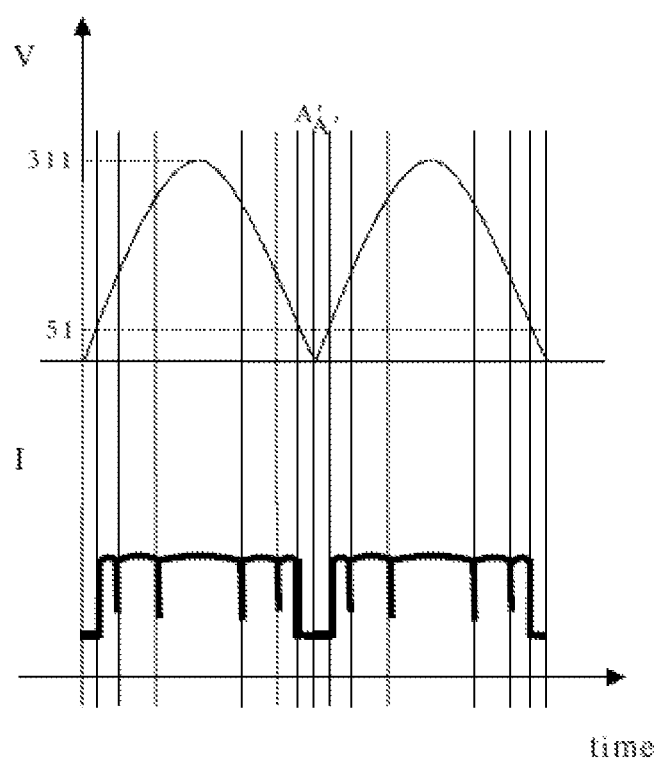
FIG. 14B shows a voltage-time and current-time graph of the fourth embodiment during two periods of a pulsed direct current signal.

FIG. 14A discloses a light-emitting device 700 according to the seventh embodiment of the present disclosure. The seventh embodiment of the light-emitting device 700 has the similar structure with the fourth embodiment of the light-emitting device 400, except that each of the light-emitting units 10, 20, 30, 40 comprises a capacitor 91 connected in parallel therewith. FIG. 14B shows, during two periods (first and second periods), the voltage-time and current-time graph of the light-emitting device 400 according to the fourth embodiment of the present disclosure.

Figure 14C:
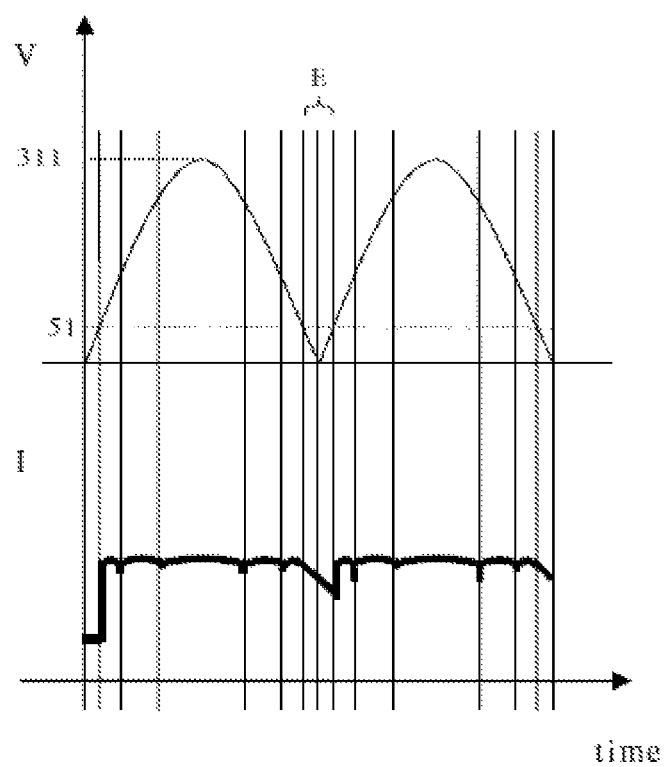
FIG. 14C shows voltage-time and current-time graph of the seventh embodiment during two periods of a pulsed direct current signal.
Figure 15:
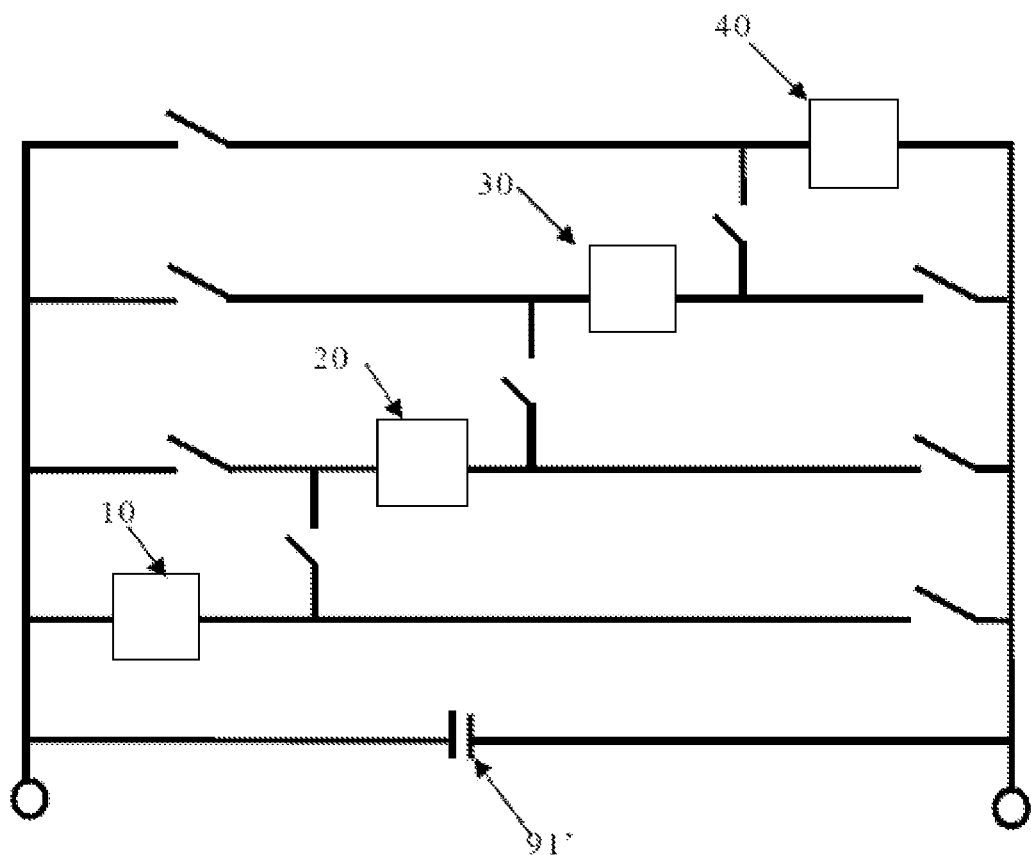
FIG. 15 shows a circuit diagram of a light-emitting device in accordance with another embodiment of the present disclosure.

When the voltage of the first period is dropped from the peak (311V) and the voltage of the periodic voltage signal is in the range of 51-0V, since the voltage is less than the operation voltage of the light-emitting units 10, 20, 30, 40, the light-emitting units 10, 20, 30, 40 do not emit light. When the voltage of the second period is initially raised (during the voltage in the range of 0-51V, A'), the voltage is still less than the operation voltage of the light-emitting units 10, 20, 30, 40, and therefore the light-emitting units 10, 20, 30, 40 do not also emit light. FIG. 14C shows a voltage-time and current-time graph of the light-emitting device 700 according to the seventh embodiment of the present disclosure. In this embodiment, each of the light-emitting units 10, 20, 30, 40 is parallelly connected with the capacitor 91. When the voltage of power supply is greater than the voltage of the capacitor 91, the capacitor 91 is in a charged state; when the voltage of the power supply is less than the voltage of the capacitor 91, the capacitor 91 is in a discharged state and acts as a power supply source for providing a current for the corresponding light-emitting units 10, 20, 30, 40. Accordingly, during the voltage of the first period in the range of 51-0V (E) and the voltage of the second period in the range of 0-51V (E), although the voltage of power supply is less than the operation voltage of the light-emitting units 10, 20, 30, 40, the light-emitting units 10, 20, 30, 40 can still emit light during this range (E) due to the capacitor 91 parallelly connected with the light-emitting units 10, 20, 30, 40 as a temporary power supply source. In this embodiment, the capacitor 91 comprises a polarized capacitor (ex. electrolytic capacitor) or a non-polarized capacitor (ex. metal-insulator-metal capacitor or ceramic capacitor). It is noted that the capacitor 91 parallelly connected with the light-emitting units 10, 20, 30, 40 can be the same type (non-polarized capacitor or polarized capacitor) with different capacitance; or the different type with the same capacitance; or the different type with the different capacitance. Each of the capacitors 91 has a capacitance less than 1000 μF. As shown in FIG. 15, the capacitor 91' is configured between the rectifier 1 (see FIG. 1) and light-emitting units 10, 20, 30, 40, and is connected parallelly with the light-emitting units 10, 20, 30, 40.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device capable of receiving a periodic voltage signal comprising a first voltage signal, a second voltage signal, and a third voltage signal in sequence, the light-emitting device comprising:
   a first light-emitting unit;
   a second light-emitting unit; and
   a switching unit electrically connected to the first light-emitting unit and the second light-emitting unit,
   wherein the first voltage signal, the second voltage signal, and the third voltage signal is configured to introduce a first current signal, a second current signal, and a third current signal, respectively, and
   wherein the light-emitting device is configured to emit a first light when introducing the first current signal, the second current signal, and the third current signal in sequence,
   wherein the light-emitting device is configured to emit a second light when introducing the second current signal and the third current signal without introducing the first current signal in advance, and
   wherein the light-emitting device is configured to emit a third light when introducing the second current signal without introducing the first current signal and the third current signal.

2. The light-emitting device of claim 1, further comprising a capacitor electrically connected to the first light-emitting element unit in parallel.

3. The light-emitting device of claim 1, wherein each of the first and second light-emitting units comprises a first bonding pad and a second bonding pad.

4. The light-emitting device of claim 1, wherein the first light-emitting unit and the second light emitting unit are commonly formed on a substrate.

5. The light-emitting device of claim 1, wherein the first voltage signal is in a range of 27-80V, the second voltage signal is in a range of 54-150V.

6. The light-emitting device of claim 1, wherein the first light-emitting unit comprises N numbers of light-emitting diodes, the second light-emitting unit comprises M numbers of light-emitting diodes, wherein N≥1, M≥1, and N-M≤3.

7. The light-emitting device of claim 1, further comprising a current-limiting unit electrically connected to the first light-emitting unit.

8. The light-emitting device of claim 1, wherein the first light-emitting unit, the second light-emitting unit and the switching unit are commonly formed on a carrier.

9. The light-emitting device of claim 1, wherein the first light-emitting unit and the second light-emitting unit can be combined in connections with different time durations.

\* \* \* \* \*